(12) United States Patent
Candage et al.

(10) Patent No.: US 7,795,915 B2
(45) Date of Patent: Sep. 14, 2010

(54) MULTI-LEVEL SIGNALING

(75) Inventors: Anthony B. Candage, Center Harbor, NH (US); Gary D. Polhemus, Sebago, ME (US); Hrvoje Jasa, Scarborough, ME (US); Robert T. Carroll, Andover, MA (US)

(73) Assignee: CHiL Semiconductor Corporation, Tewksbury, MA (US)

( * ) Notice: Subject to any disclaimer, the term of this patent is extended or adjusted under 35 U.S.C. 154(b) by 100 days.

(21) Appl. No.: 12/185,596

(22) Filed: Aug. 4, 2008

(65) Prior Publication Data

US 2010/0026261 A1 Feb. 4, 2010

(51) Int. Cl.
*H03K 19/00* (2006.01)
*G05F 1/00* (2006.01)

(52) U.S. Cl. .......................... 326/59; 326/60; 323/283; 323/284; 323/272

(58) Field of Classification Search ............. 326/59–60; 323/283, 284, 274
See application file for complete search history.

(56) References Cited

U.S. PATENT DOCUMENTS

| | | | | |
|---|---|---|---|---|
| 4,449,065 A | | 5/1984 | Davies, Jr. | |
| 4,706,299 A | * | 11/1987 | Jorgensen | 398/176 |
| 5,912,563 A | * | 6/1999 | Garnett | 326/60 |
| 5,963,053 A | * | 10/1999 | Manohar et al. | 326/60 |
| 6,049,229 A | * | 4/2000 | Manohar et al. | 326/83 |
| 6,140,841 A | * | 10/2000 | Suh | 326/60 |
| 6,211,698 B1 | * | 4/2001 | Suh | 326/60 |
| 6,339,622 B1 | * | 1/2002 | Kim | 375/287 |
| 2002/0158663 A1 | * | 10/2002 | Shemesh | 326/59 |

* cited by examiner

*Primary Examiner*—Vibol Tan
(74) *Attorney, Agent, or Firm*—Chapin IP Law, LLC; Barry W. Chapin, Esq.

(57) ABSTRACT

A control circuit generates an output based on the first signal and the second signal by encoding the output to be a multi-state signal having at least three states. A magnitude of the multi-state signal generated by the controller varies depending on binary states of the first signal and the second signal. The controller utilizes the output (i.e., the multi-state signal) to control a switching circuit. A driver circuit receives the output generated by the control circuit. In one embodiment, the multi-state signal has more than two different logic states. The driver decodes the multi-state signal for generating signals to control switches in the switching circuit. One signal generated by the driver circuit is a pulse width modulation signal; another signal generated by the driver circuit is an enable/disable signal.

30 Claims, 17 Drawing Sheets

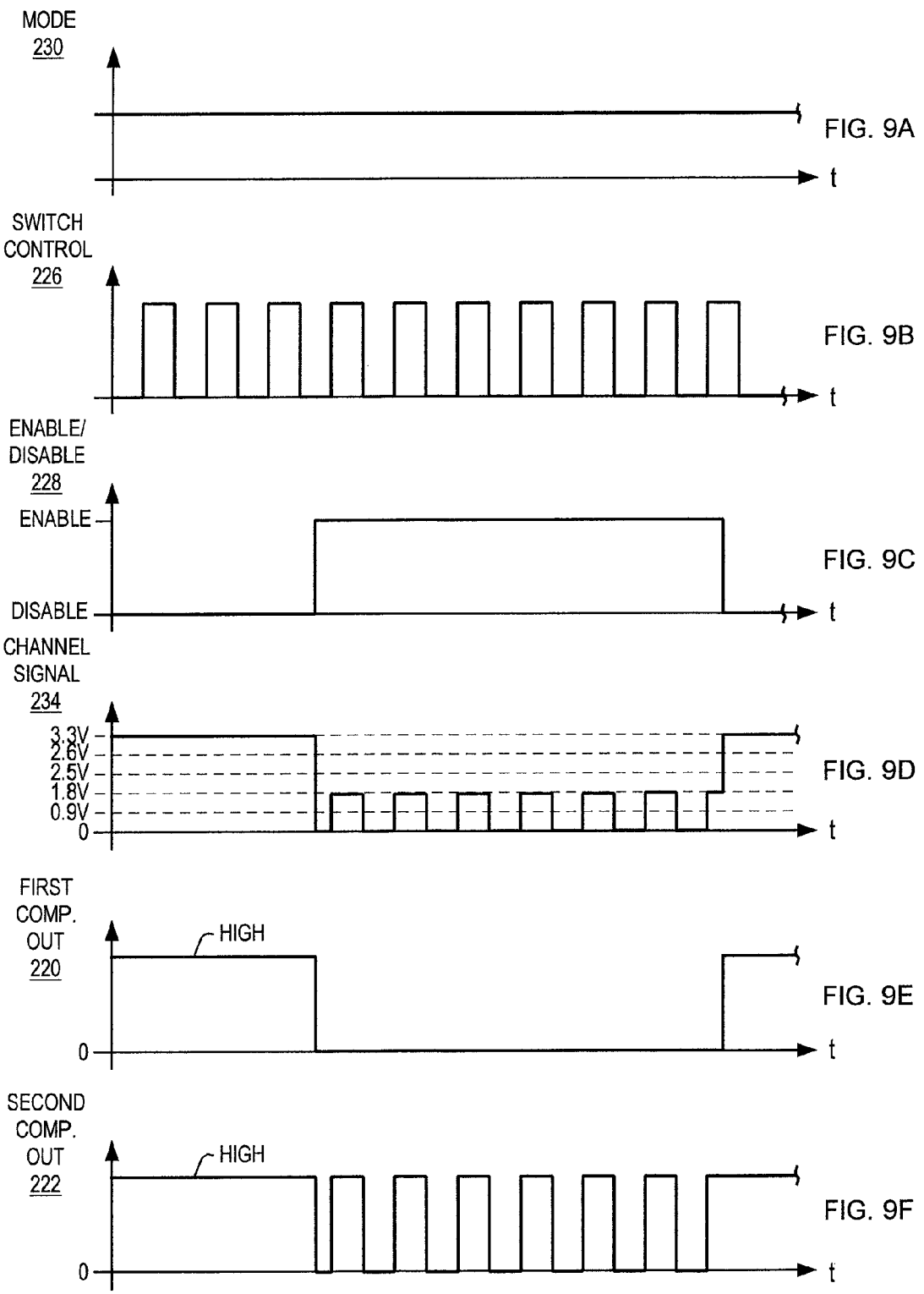

MULTI-LEVEL SIGNALING

BACKGROUND

Conventional binary signaling includes sending information by means of two distinguishable states (e.g., 1 and 0). Conventional ways of transferring multi-state information (e.g., information that has more than two distinguishable states) over a single channel (e.g., a single wire plus a return) requires some form of multi-state encoding.

One conventional way to send multi-state information over a single signal channel is to encode the multi-state digital data into packets of bits and send the packets using binary serial signaling.

Another conventional way to send multi-state information over single signal channel is to associate different signal amplitudes with different states. In one example, a "ternary" or "three-state" communication scheme comprises a sending unit to encode a sequence of three distinguishable digital states into a signal comprising three distinct signal amplitudes and a receiving unit that receives and decodes the signal levels to reconstruct the original sequence of digital states. An example of such a system is described in Gruodis et al, U.S. Pat. No. 3,155,845, "Three Level Converter," issued Nov. 3, 1964.

With reference to FIG. 1, multiphase switching power converters (e.g., multiphase switching power converter 10) may comprise a plurality of switching power converter phases 14a 14b . . . 14n controlled by a digital phase controller 12. As described in U.S. patent application Ser. No. 11/969,659 entitled "Power Supply and Controller Circuits" (hereafter referred to as the "Digital Control Application," which is assigned to the same assignee as the subject application and which is incorporated in its entirety by reference, a digital phase controller 12 can send both binary switch state information as well as phase enable/disable control information to each phase.

For example, when a phase (e.g., phase 14a, FIG. 1) is enabled by the digital controller 12, the ON and OFF states of a pair of switches in the phase (e.g., switches SPa and SSa, FIG. 1) may be defined by the state of a binary PWM signal sent by the controller: e.g., a power switch (e.g., switch SPa, FIG. 1) is ON and a synchronous switch (e.g., switch SSa, FIG. 1) is OFF when the binary PWM signal is high, and the power switch is OFF and the synchronous switch is ON when the binary PWM signal is low.

When the phase is disabled by the digital controller, however, both the power and phase switches are turned off. Thus, three distinct switch states are possible for the combination of the power switch and the synchronous switch: ON/OFF, OFF/ON, and OFF/OFF.

One way to communicate this information is to use a pair of channels (e.g., one "enable/disable" channel and one switch control channel); another way is to use a three-state signaling scheme over one channel.

An example of a multiphase switching converter using a plurality of three-state channels to connect a digital controller chip to a plurality of power converter phases is shown in data sheet FN9159.6, entitled "ISL6612A, ISL6613A Advanced Synchronous Rectified Buck MOSFET Drivers with Pre-POR OVP," dated Jul. 27, 2006, published by Intersil Corporation, Milpitas, Calif., USA (the "Intersil Data Sheet").

BRIEF DESCRIPTION

Conventional encoding and decoding of multiple binary signals as discussed above suffer from a number of deficiencies. For example, as mentioned above, each power converter phase in a switching power supply requires two control signals: a pulse width modulation signal and an enable signal. Allocation of a pair of pins (one for the pulse width modulation signal and an enable signal) on both a controller and driver circuit for each power converter phase can be quite costly when a power supply includes many phases. For example, if a power supply includes five power converter phases, each of the controller and driver chip must allocate 10 pins to accommodate the signals.

Techniques discussed herein deviate with respect to conventional applications such as those discussed above. For example, certain embodiments herein are directed to configuring a multi-state signal for use in a specialized application such as a switching power supply circuit and/or switching circuits in general.

More specifically, according to one embodiment, a circuit receives a first signal and a second signal. The first signal can be a pulse width modulation signal used to control switching of one or more switches to ON/OFF states. The second signal can be an enable/disable signal associated with the switches. During operation, the controller generates an output based on the first signal and the second signal by encoding the output to be a multi-state signal having at least three states. A magnitude of the multi-state signal generated by the controller varies depending on binary states of the first signal and the second signal. The controller utilizes the output (i.e., the multi-state signal) to control a switching circuit.

Embodiments herein can include a driver circuit configured to receive the output generated by the controller. The driver receives the multi-state signal from the controller. In one embodiment, the multi-state signal has more than two different logic states. The driver decodes the multi-state signal and generates an output based on the decoding. The output of the driver includes a first signal and a second signal for controlling a switching circuit. In one embodiment, the first signal generated by the driver is a pulse width modulation signal; the second signal generated by the driver is an enable/disable signal.

By way of a non-limiting example, the switching circuit can include one or more power converter phases, each of which includes high side switch circuitry and low side switch circuitry to control conveyance of power from one or more voltage sources through an inductor to a respective load. In one embodiment, the switching circuit is part of a DC-DC buck converter.

Each multi-state signal generated by the controller and conveyed to the driver circuit controls high side switch circuitry and low side switch circuitry for a respective power converter phase. For example, as previously discussed, the controller utilizes a pulse width modulation and enable/disable signal to generate a multi-state signal. The controller utilizes the multi-state signal to control operation associated with a first switch and a second switch in a respective switch circuit. A first state of the multi-state signal causes simultaneous activation the first switch and deactivation of the second switch. A second state of the multi-state signal causes simultaneous deactivation of the first switch and activation the second switch. A third state of the multi-state signal causes simultaneous deactivation of both the first switch and the second switch.

The driver decodes the multi-state signal received from the controller circuit to control operation of high side switch circuitry and low side switch circuitry in the respective phase controlled by the multi-state signal. For example, in response to detecting that a magnitude of the multi-state signal repeatedly crosses a first threshold value (such as based on the multi-state signal being greater than and less than the threshold value) but that the multi-state signal does not cross or reach a second threshold value, the driver circuit toggles a first switch control signal to alternate between activating first switch circuitry in the switching circuit and activating a second switch in the switching circuit.

In one embodiment, when the multi-state signal is less (or greater) than the first threshold value, the driver activates the high side switch circuitry and deactivates the low side switch circuitry. When the multi-state signal is greater (or less) than the first threshold value, the driver initiates activation of the low side switch circuitry and deactivation of the high side switch circuitry. However, in response to detecting that the magnitude of the multi-state signal crosses (e.g., becomes greater than) the second threshold value, the driver initiates deactivation of both the first switch circuitry and the second switch circuitry.

Embodiments herein are novel and useful over conventional tri-state signaling. For example, toggling of the multi-state signal within a range such as above and below a first threshold value enables the driver to reproduce a pulse width modulation for alternating between activating a high side switch circuitry and low side switch circuitry of a respective power converter phase. When the multi-state signal moves outside of the range such as above the second threshold value, the driver circuit deactivates both the high side switch circuitry and the low side switch circuitry of the respective power converter phase. Such a configuration enables a smooth transition between control states. For example, enabling of the switch circuit in the multi-state signal coincides with the switching of the multi-state signal above and below the first threshold value within the range. When outside of the range, both the high side switch circuitry and low side switch circuitry are deactivated.

Thus, a multi-state signal (e.g., a voltage control signal or a current control signal) according to embodiments herein can smoothly transition from a first state (causing activation of low side switch circuitry and deactivation of high side switch circuitry) through a second state (causing activation of high side switch circuitry and deactivation of low side switch circuitry) to a third state (causing deactivation of both the low side switch circuitry and the high side switch circuitry).

Although techniques herein are well suited for use in switching power supply circuitry, it should be noted that embodiments herein are not limited to use in such applications and that the techniques discussed herein are well suited for other applications as well.

Note also that each of the different features, techniques, configurations, etc. discussed herein can be executed independently or in combination with any or all other features also described herein. Accordingly, the present invention can be embodied, viewed, and claimed in many different ways.

This brief description does not specify every embodiment and/or incrementally novel aspect of the present disclosure or claimed invention. Instead, this brief description only provides a preliminary discussion of different embodiments and corresponding points of novelty over conventional techniques. For additional details and/or possible perspectives or permutations of the invention, the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles and concepts.

FIGS. 9A, 9B, 9C, 9D, 9E, and 9F are example timing diagrams according to embodiments herein.

DETAILED DESCRIPTION

Figure 1:
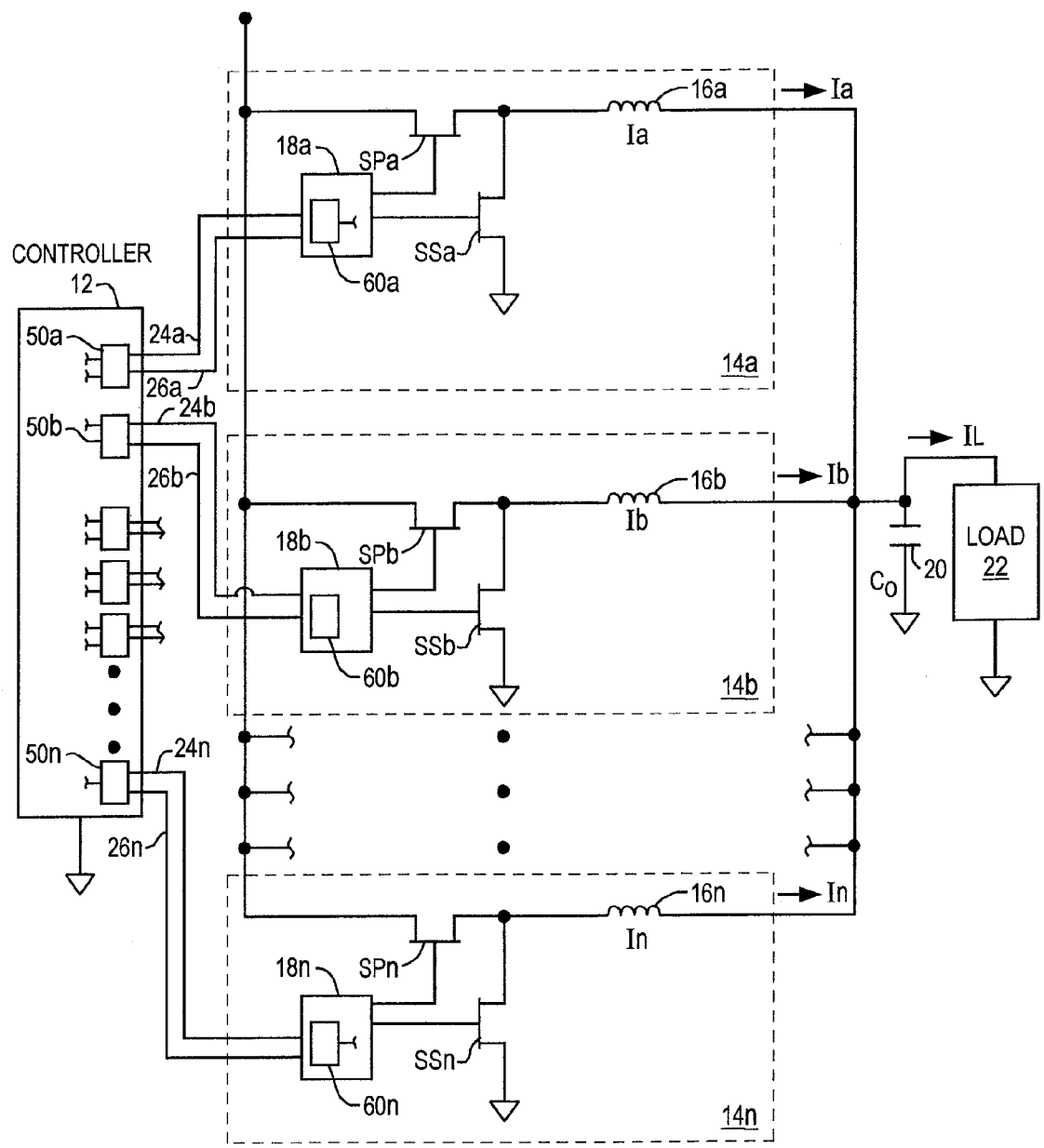
FIG. 1 is an example diagram illustrating a multiphase switching power converter circuit according to conventional technology.

FIG. 1 shows a simplified schematic diagram of a prior art multiphase power converter 10 according to conventional methods. In the figure a digital controller 12 sends a pair of channels (e.g., channel pairs 24a, 26a; 24b, 26b; 24n, 26n) to each of a plurality of switching power converter phases 14a, 14b . . . 14n.

Channels 24a, 24b . . . 24n carry binary enable/disable control signals; channels 26a, 26b . . . 26n carry switch control signals that indicate the desired states of one or more of the switches in the converter.

Each buck switching power converter phase 14a, 14b . . . 14n comprises a phase switch controller 18a, 18b . . . 18n, a power switch SPa, SPb . . . SPn, a synchronous switch SSa, SSb . . . SSn, and an inductor 16a, 16b . . . 16n. Enable/disable control and switch control signals are generated by drivers 50a, 50b, 50n (which may be part of controller 12, as illustrated in FIG. 1, or which may be external to the controller) and are detected and decoded by receivers 60a, 60b . . . 60n (which may be part of the phase switch controllers 18a, 18b . . . 18n, or which may be external to the phase switch controllers).

The currents, Ia, Ib . . . In, delivered by switching power converter phases 14a, 14b . . . 14n are combined to supply the load current, IL, to load 22. Filter capacitance 20 smoothes the voltage across the load.

In operation, the controller 12 may "disable" a phase 14 by driving the phase's binary enable/disable control signal line 24 to a logical low level, causing the phase switch controller 18 in the phase to turn OFF both the power switch SP and the synchronous switch SS in the phase, rendering the phase inactive from a power conversion viewpoint. Alternatively, the controller 12 may "enable" a phase by driving the phase's enable/disable control signal line 24 to a logical high level.

When a phase is so enabled, the states of the power switch SP and synchronous switch SS in the phase are controlled by the logic level on the switch control channel 26 connected to the phase: e.g., when the logic level on the switch control channel is high, it is interpreted by the phase switch controller 118 as indicating that the power switch SP is to be turned ON and the synchronous switch SS is to be turned OFF; when the logic level on the switch control channel is low, it is interpreted by the phase switch controller 118 as indicating that the power switch SP is to be turned OFF and the synchronous switch SS is to be turned on. The phase controller may insert delays between the time at which one switch (e.g., switch SPa) is turned on and the time at which the other switch (e.g., switch SSa) is turned off, and vice versa, as a means of preventing conduction overlap and/or to encourage zero-voltage switching.

For convenience, with respect to a power converter phase 14, we will refer to a state in which the phase is enabled and the logic level on the switch control channel indicates that the power switch SP is to be turned ON and the synchronous switch SS is to be turned OFF, as an "enabled-ON" state; we will refer to a state in which the phase is enabled and the logic level on the switch control channel indicates that the power switch SP is to be turned OFF and the synchronous switch SS is to be turned ON, as an "enabled-OFF" state; we will refer to a state in which the phase is being controlled to be in either of the enabled-ON or enabled-OFF states as being an "enabled" state; and we will refer to a state in which the phase is disabled (i.e., both the power switch SP and the synchronous switch SS are to be turned OFF) as a "disabled state."

As explained in the Digital Control Application, in a steady state mode of operation the power switches SPa, SPb ... SPn, and the synchronous switch SSa, SSb ... SSn in power conversion phases 14a, 14b ... 14n, may be controlled by the digital controller 12 to be turned ON in a non-overlapping, interleaved fashion, in a series of converter operating cycles, as a means of regulating the load voltage, Vo, at a pre-determined setpoint value. Interleaved operation provides a number of benefits, for example reduced ripple voltage across the load 22. Thus, in preferred embodiments of multiphase power converters, each power converter phase 14a, 14b ... 14n may receive a different, phase-shifted, switch control signal via a corresponding different channel 24a, 24b ... 24n. As also explained in the Digital Control Application, in order to improve efficiency and minimize storage capacitance 20, the digital controller 12 may be required to enable or disable individual switching power converter phases, thereby requiring that a separate enable/disable control signal channel 24a, 24b ... 24n, and a corresponding separate connection to digital controller 12, be provided for each switching power converter phase. Additional connections may increase the cost and size of the digital controller (e.g., if the controller is embodied as an integrated circuit, each additional connection requires an additional package pin) and the extra pins and connections may result in a more complex and costly printed circuit board.

Figure 2:
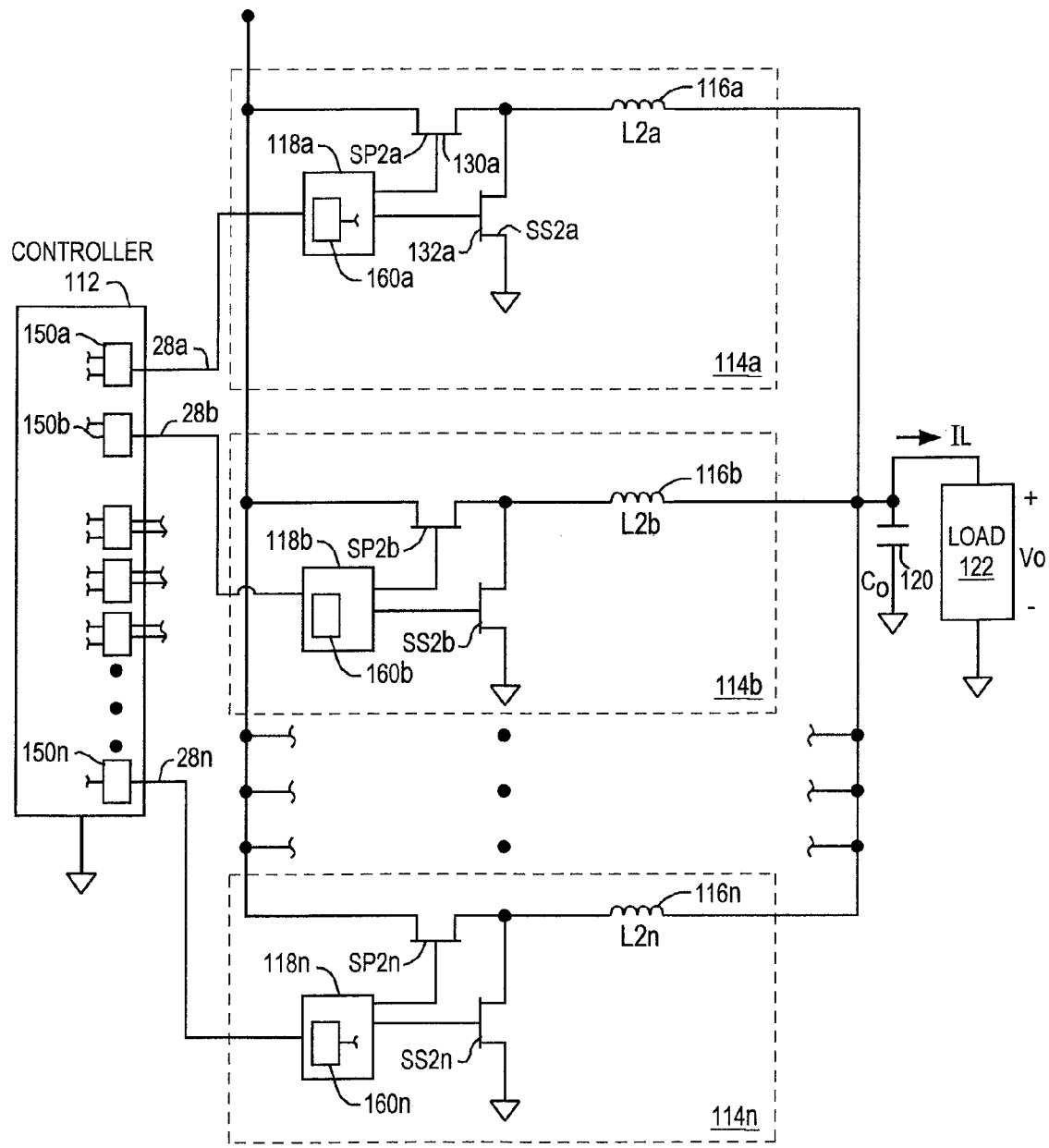
FIG. 2 is an example diagram illustrating a multiphase switching power converter according to embodiments herein.

FIG. 2 shows another multiphase power converter 110. The converter 110 of FIG. 2 differs from the converter 110 of FIG. 1 in that a single channel 28a, 28b ... 28n is connected between the controller 112 and each of the phases 114a, 114b ... 114n. Three-state channel signals are generated by three-state drivers 150a, 150b, ... 150n (which may be part of controller 112, as illustrated in FIG. 2, or which may be external to the controller) and are detected and decoded by three-state receivers 160a, 160b ... 160n (which may be part of the phase switch controllers 118a, 118b ... 118n, or which may be external to the phase switch controllers).

Figure 3A:
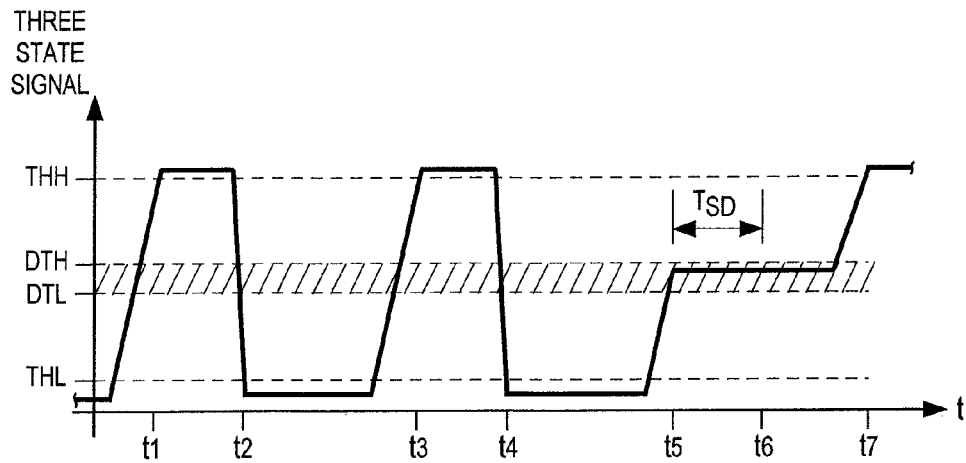
FIG. 3 is an example diagram according to embodiments herein.
Figure 3B:
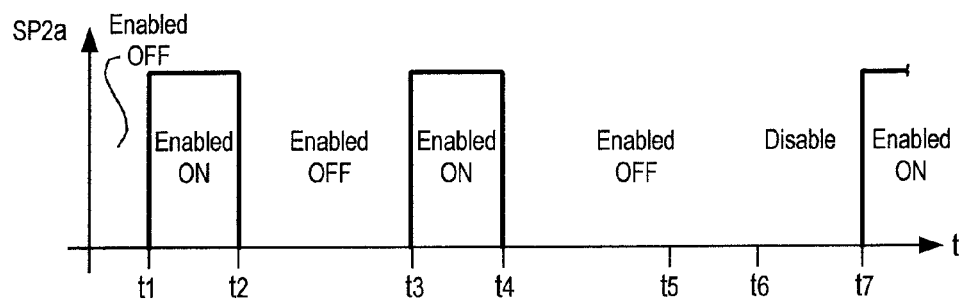
Figure 3C:
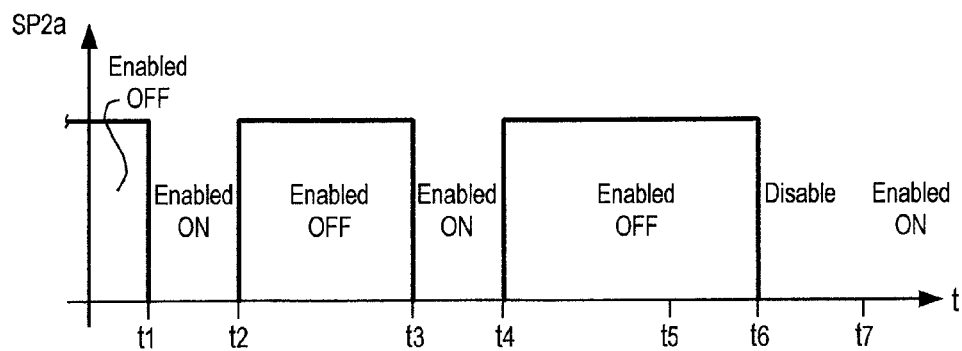

FIGS. 3A, 3B, and 3C shows waveforms that illustrate an example of a scheme for three-state control of phases 114a, 114b ... 114n according to conventional methods.

FIG. 3A shows an example of a multi-state signal waveform (i.e., in the converter of FIG. 2, a signal delivered by controller 112, via channel 28a, to the phase switch controller 118a in phase 114a). When the three-state signal is above a high threshold THH (e.g., in FIG. 3A, after time t1), it indicates that the phase is enabled-ON; when the three-state signal is below a low threshold THL (e.g., in FIG. 3A, after time t2), it indicates that the phase is enabled-OFF; (3) when the three-state signal is within a "phase disable band" (in FIG. 3A, the cross-hatched region between a lower disable limit DTL and an upper disable limit DTH), it indicates that the phase is disabled.

As shown in FIGS. 3B and 3C, the phase switch controller 118a controls the states of the phase switches, SP2a and SS2a, in phase 114a, FIG. 2, based upon the state of the three-state signal. At time t1, the three-state signal rises above the threshold THH, indicating to the switch controller 118a that the phase 114a is enabled-ON. At time t2, the three-state signal falls below threshold THL, indicating to the switch controller 118a that the phase is enabled-OFF. This process of controlling the phase 114a to transition between complementary states (i.e., enabled-ON and enabled-OFF) is repeated at times t3 and t4. By this means, the three-state signal may control power delivery from a phase by controlling the relative durations of the ON and OFF times of the switches in the phase. As noted earlier, the switch controller 118a can be configured to sequence the turning on and off of the two switches, e.g. to prevent conduction overlap or to encourage zero-voltage switching.

As shown in a combination of FIGS. 3A, 3B, and 3C, transitions of the three-state signal between its enabled-ON and enabled-OFF states always involve a finite period of time during which the signal is passing through the phase disable band (between DTL and DTH). To ensure correct operation, however, the phase controller 118a can be configured to distinguish between slow rise and fall times of the three-state signal (between enabled-ON and enabled-OFF states) and a true "disable" signal condition. The phase controller 118a may therefore be configured so that it will only distinguish a disabled condition if the three-state signal has been within the phase disable band for at least a pre-determined "disable-holdoff time" TSD.

In FIG. 3A, for example, the three-state signal enters the disable threshold region at time t5. At time t6 the signal has been in the region for a period equal to TSD, and, as illustrated in FIGS. 3B and 3C, the phase controller disables the phase 114a by turning off switches SP2a and SP2b. In one example, the Intersil Data Sheet specifies a phase controller as having a typical disable-holdoff time of 245 nanoseconds. At time t7, the three-state signal once again rises above the threshold THH, indicating to the switch controller 118a that the phase 114a is to enter the enabled-ON state.

A problem with the three-state scheme of FIG. 3 is the complexity associated with the need for disable-holdoff timing circuitry. Another problem is associated with the relative size of the disable threshold region (i.e., the difference between DTH and DTL) and the placement of the region in between the two enabled states (THH and THL).

On the one hand it is desirable to keep the disable threshold region small, to minimize the chance that a disable signal will be falsely detected as the three-state signal passes between the enabled-ON and enabled-OFF states. On the other hand, a small disable threshold region requires more precise control of the three-state waveform; associated waveform generation and detection circuitry; and printed circuit board layout.

As mentioned above, this application is related to earlier filed U.S. patent application Ser. No. 11/969,659 entitled "POWER SUPPLY AND CONTROL CIRCUITS", filed on Jan. 4, 2008, the entire teachings of which are incorporated herein by this reference.

As described in the POWER SUPPLY AND CONTROL CIRCUITS application, it may be useful that phases be enabled or disabled very rapidly, e.g., in less than 20 nanoseconds, in order that the power converter 110 can respond to rapid, large, changes in load while at the same time operating efficiently and with relatively small amounts of filter capacitance 120. In such converters, the need for a disable-holdoff time, TSD, may result in enable/disable delays that are unacceptably large.

Figure 4:
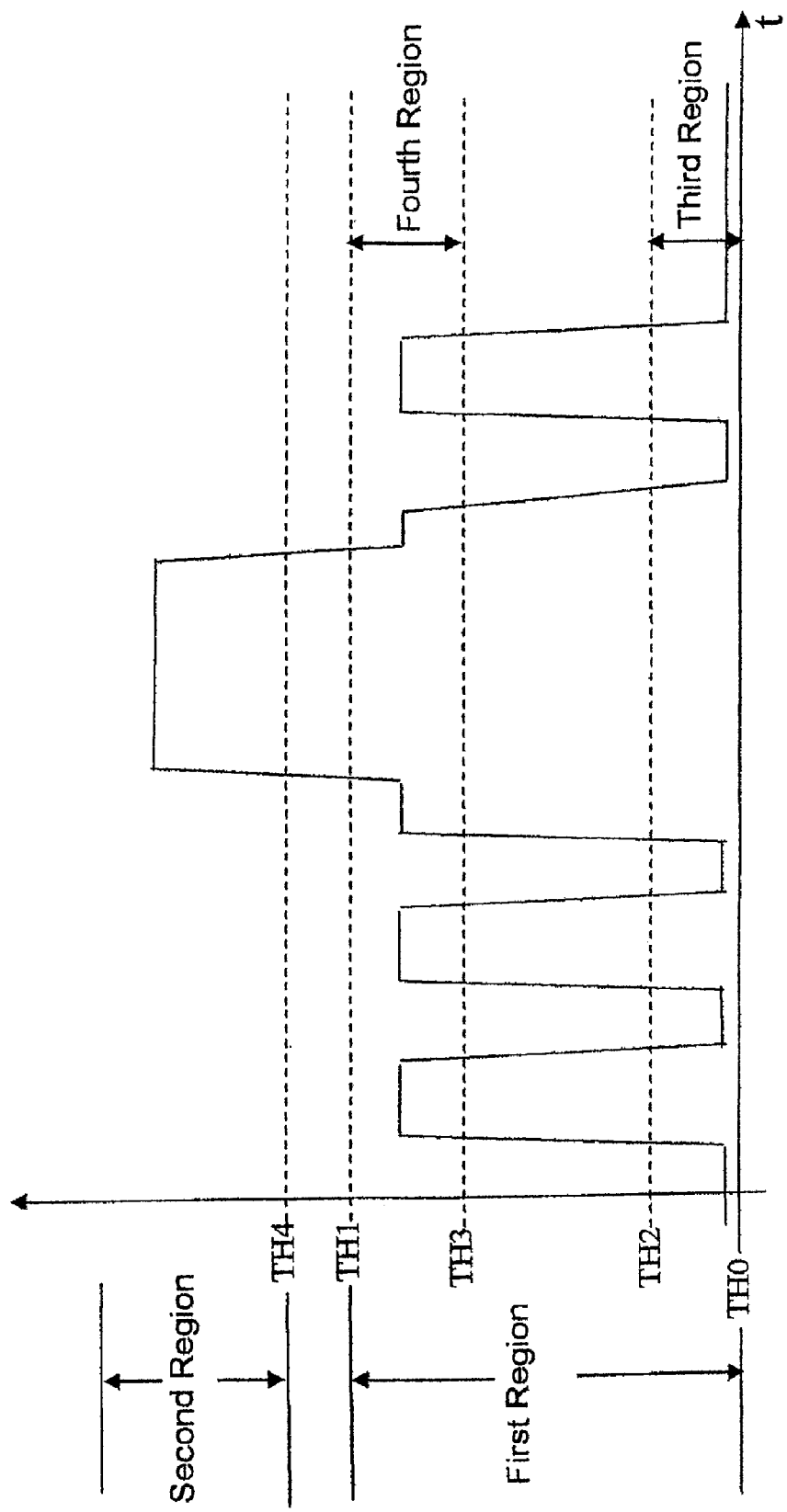
FIGS. 4, 5 and 6 are example timing diagrams according embodiments herein.

FIG. 4 shows a three-state signal according to embodiments herein. The signaling scheme will first be discussed in the context of the power converter system 110 of FIG. 2. It is understood, however, that the scheme is broadly applicable beyond power conversion.

In FIG. 4, the three-state signal makes transitions between a first region and a second region. Both the first region and the second region occupy a respective continuous range of values: in FIG. 4 the first region occupies values between TH0 and TH1; the second region occupies values above TH4.

By way of a non-limiting example, the first and second regions are also distinct from each other, by which we mean that there is no overlap between the regions. Although the example of FIG. 4 illustrates a gap between the first region and the second region (i.e., the gap between TH1 and TH4), such a gap is not required so long as the regions do not overlap (i.e., TH1 may be equal to TH4, making the first and the second regions contiguous).

In the signaling scheme of FIG. 4, the presence of a signal in one or the other of the first region or the second region is indicative of one or the other of the states of a first binary variable: e.g., when a signal is present in the first region the first binary variable may be 0; when a signal is present in the second region the first binary variable may be 1. In FIG. 4 the first region is shown to be further discriminated into a third region and a fourth region, the presence of a signal in one or the other of the third region or the fourth region being indicative of the state of a second binary variable: e.g., when a signal is present in the third region the second binary variable may be 0; when a signal is present in the fourth region the second binary variable may be 1. As discussed below, detection of the signal within a region may involve simple level-detection and/or hysteretic level detection without the need for enable/disable delays.

Figure 5A:
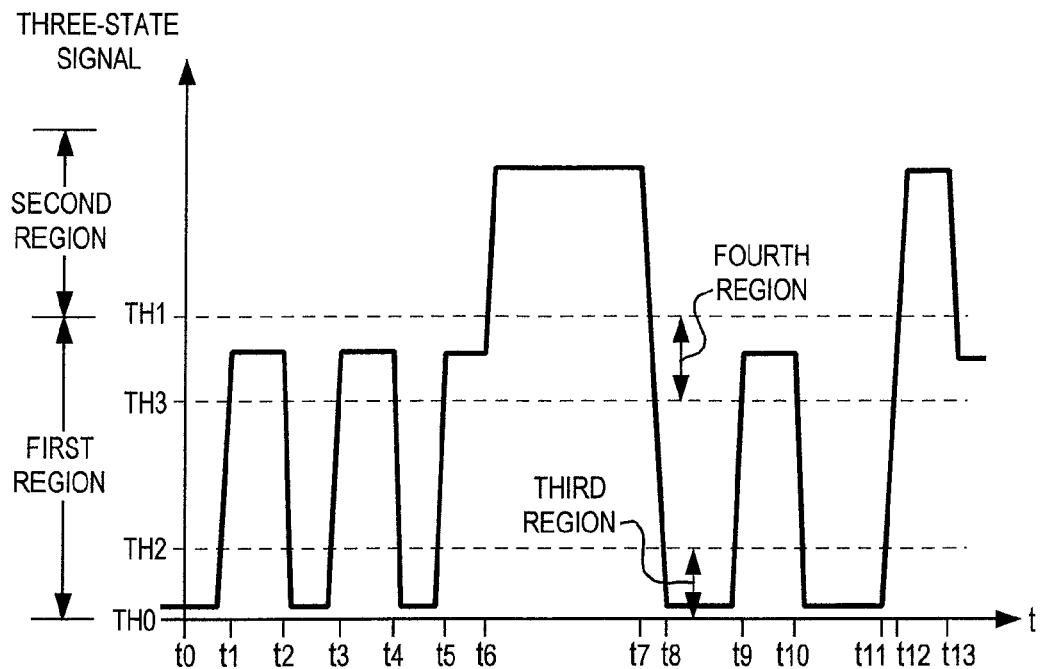

FIGS. 5 and 6 show examples of waveforms for a power converter 110 of FIG. 2 using the three-state signal of FIG. 4. The waveforms of FIGS. 5A and 6A show, respectively, a three-state signal delivered by the controller 112, via channel 28a, to the phase switch controller 118a in phase 114a.

Figure 5B:
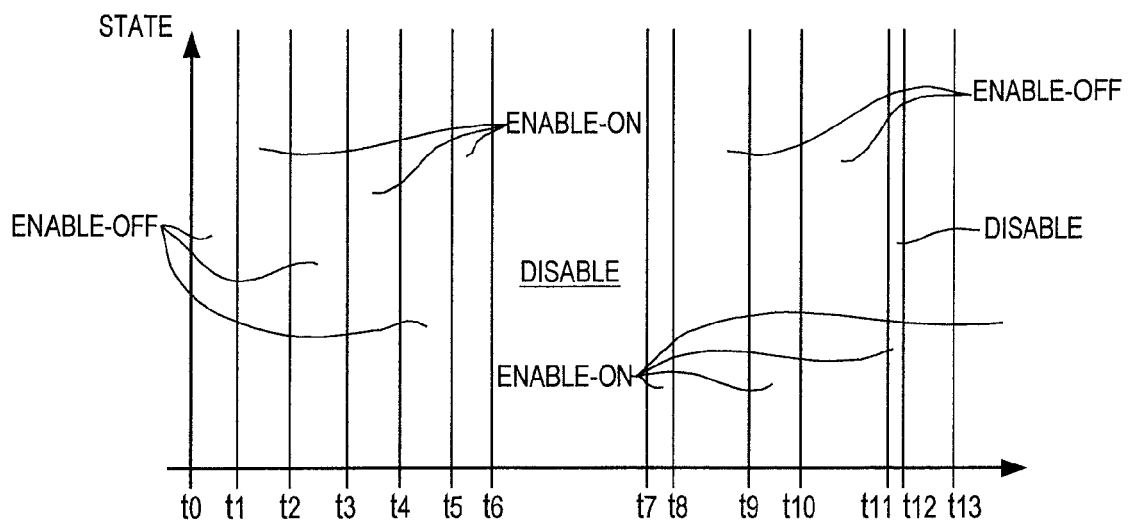
Figure 6A:
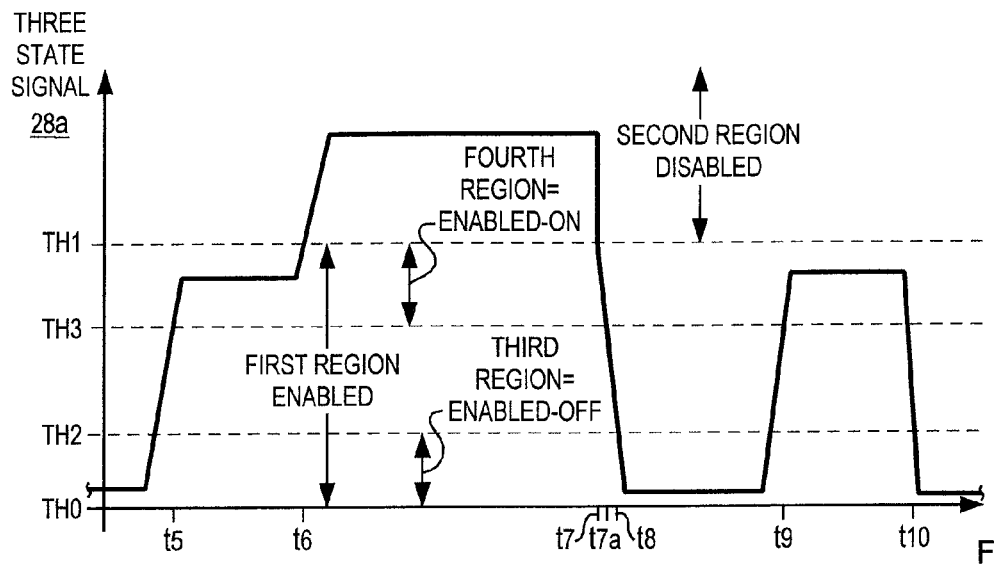

In the waveforms of FIGS. 5A and 6A, the first region and the second region are contiguous, the first region occupying the range between TH0 and TH1 and the second region occupying the range above TH1. In the examples of FIGS. 5 and 6, the first and second regions represent, respectively, the true and false binary states of a "phase-enable/disable" state: whenever the three-state signal is within the first region the phase-enable/disable state is true and the phase is enabled; whenever the three-state signal is within the second region the phase-enable/disable state is false and the phase is disabled by turning off both respective high side switch circuitry and low side switch circuitry of a respective phase. When the signal is in the first region and also in the third region (i.e., has a value between TH0 and TH2) it indicates the "enabled-OFF" state of the phase 114a, as defined previously; when the signal is in the first region and also in the fourth region (i.e., has a value between TH3 and TH1) it indicates the "enabled-ON" state of the phase, as defined previously.

FIG. 5B shows how the state of phase 114a is controlled by the three-state signal of FIG. 5A. Between times t0 and t5, the three-state signal transitions between the third and fourth regions, causing the state of the phase 114a to transition between the enabled-OFF and the enabled-ON states; at time t6 the three-state signal increases above the TH1 threshold, causing the phase to enter the second region, indicating the disabled state; between times t7 and t11 the state of the phase again transitions back and forth between the enabled-OFF and the enabled-ON states; at time t12 the three-state signal increases again above the TH1 threshold, causing the phase to enter the disabled state. Unlike the prior art three-state scheme of FIG. 3, the range of values associated with the disabled state (i.e., values above TH1) is distinct from, and does not overlap with, the range of values associated with the enabled state (i.e., values between TH0 and TH1). As a result, the three-state signal of FIG. 5 may transition between the enabled-ON and the enabled-OFF states (i.e., the third and fourth states) without passing through values that might otherwise be indicative of the disabled state. The system of FIG. 5 is therefore more tolerant of three-state signal rise and fall times than the system of FIG. 3 and may not require timing circuitry in the phase controller to prevent false detections of a disabled state.

Figure 6B:
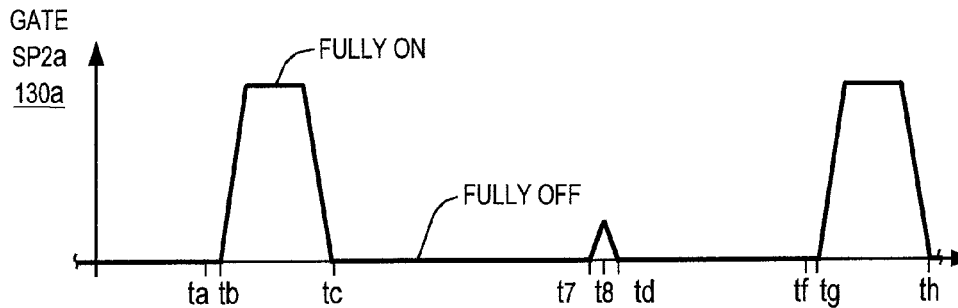
Figure 6C:
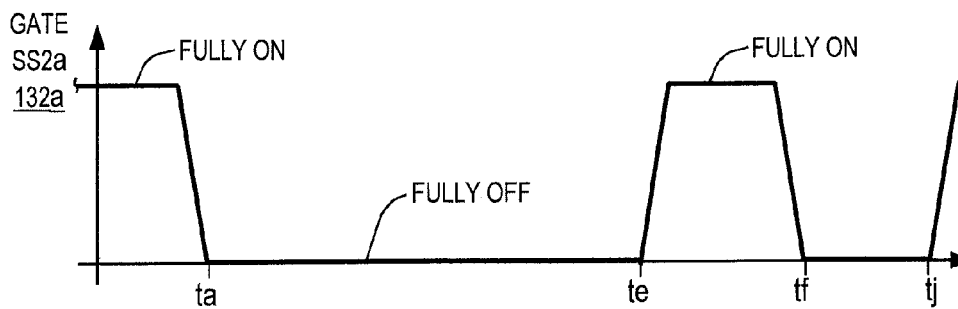
Figure 6D:
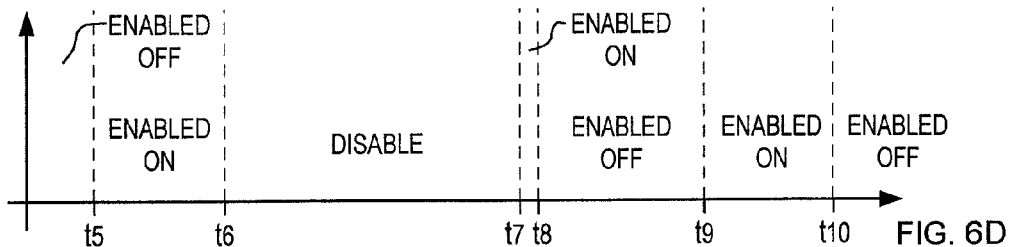

FIG. 6A shows an expanded view of a portion of the three-state waveform of FIG. 5A, between times t5 and t10; FIG. 6B shows a corresponding waveform of the voltage delivered by the phase controller 118a to the gate 130a of MOSFET power switch SP2a (FIG. 2); FIG. 6C shows a corresponding gate waveform of the voltage delivered by the phase controller 118a to the gate 132a of MOSFET synchronous switch SS2a (FIG. 2); and FIG. 6D shows the sequence of states during the time period.

At time t5 the three-state signal transitions into the fourth region, indicating to the phase controller 118a that the phase is to enter the enabled-ON state. In response, the phase controller 118a pulls the gate 132a of synchronous switch SS2a low (FIG. 6C) to turn the synchronous switch SS2a off. At time tb, after gate SS2a has been discharged (at time ta), the phase controller 118a drives the gate 130a of power switch SP2a high in order to turn the power switch Sp2a on.

As noted earlier, the phase controller may perform this "break before make" timed sequence as a means of minimizing or preventing switch conduction overlap and/or to encourage zero-voltage switching of one or the other or both of the switches.

A short time after time tb, power switch SP2a is fully on and switch SS2a is fully off. At time t6, the three-state signal makes a transition into the second region, indicating that the phase is to be disabled. The phase controller 118a responds by pulling the gate 130a of power switch low (FIG. 6B).

Shortly after time t6 both switches, SP2a and SS2a, are off (FIGS. 6B and 6C), and the phase is fully disabled. Between time t7 and t8, the three-state signal makes a transition from the disabled state (second region) to the enabled-OFF state (third region). During the transition, between times t7 and t7a, the three-state signal passes through the fourth region (enabled-ON) causing the phase controller 118a to begin driving the gate of the power switch 130a high (FIG. 6B). When, at time t8, the three-state signal enters the third region, the phase controller begins discharging the gate of the power switch SP2a to turn it off (FIG. 6B). At time te, shortly after the power switch gate 130a has discharged at time td, the phase controller 118a begins driving the gate of the synchronous switch 132a to turn it on (FIG. 6C).

Shortly after time te, the power switch SP2a is off, the synchronous switch is fully on and the phase 114a is in the enabled-OFF state. Two more phase transitions, one from the enabled-OFF state to the enabled-ON state, starting at time t9, and one from the enabled-ON state to the enabled-OFF state, starting at time t10 are shown in FIG. 6.

As shown in FIG. 6B, the transition of the three-state signal from the disabled state to the enabled-OFF state, between times t7 and t8, may result in a small perturbation in the gate voltage of the power switch (FIG. 6B). Whether or not this will cause the gate voltage to exceed the MOSFET threshold voltage and cause the switch to conduct, and the length of time that the switch may conduct and the degree of conduction, will depend on the fall time of the three-state signal and the rate at which the gate voltage may be slewed by the phase controller 118a. Because, however, the relative frequency of transitions between the enabled and disabled states may typically be much lower than the frequency of transitions between the enabled-ON and enabled-OFF states, the effect of this perturbation on system efficiency and operation may generally be negligible in comparison to the effects of such perturbations, should they be present, in a prior art system of FIG. 3, in which every transition between the enabled-ON and enabled-OFF states must always pass through the phase disable band.

Figure 7:
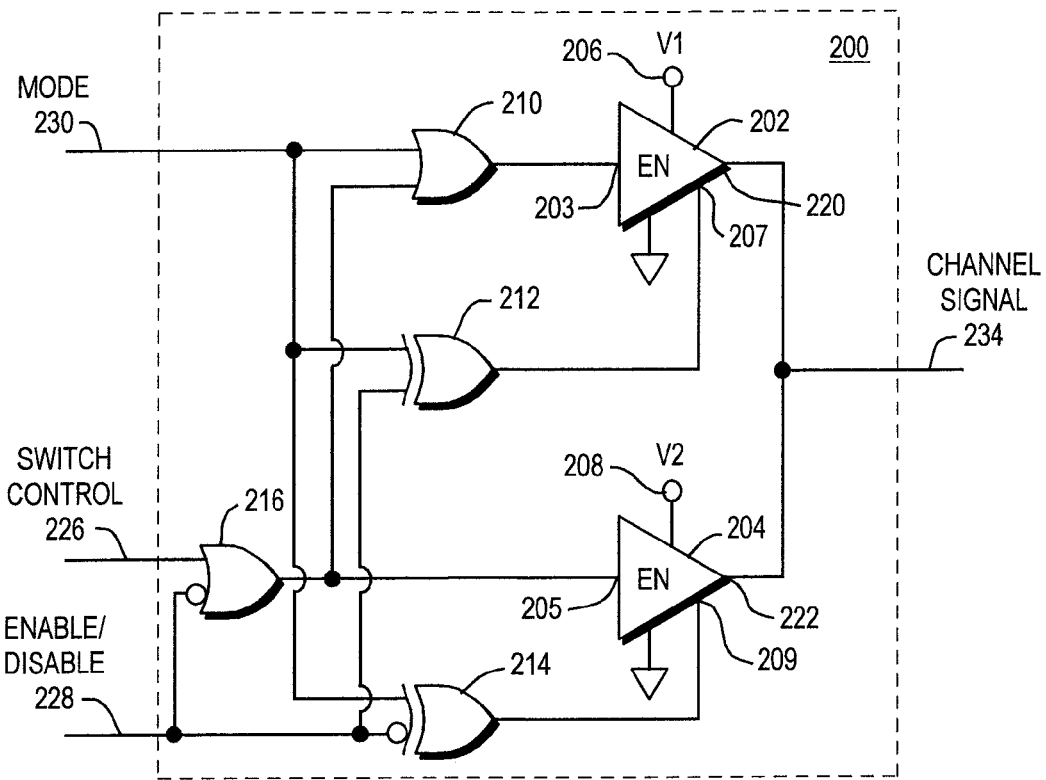
FIG. 7 is a diagram illustrating an example driver circuit according to embodiments herein.

A three-state signal may be generated using the driver circuit 200 shown in FIG. 7. The circuit comprises two drivers 202,204; exclusive-or logic gate 212; exclusive-or logic gate (with one inverting input) 214; OR logic gate 210; OR logic gate (with one inverting input) 216; and two voltage sources, one of voltage V1 206 and the other of voltage V2 208 where V1 is greater than V2. Each driver 202, 204 comprises a signal input 203, 205, an enable input 207, 209, a signal output 220, 222 and a voltage source terminal 206, 208. Each driver 202,204 is of the kind which, when enabled, by bringing its respective enable input 207, 209 high, generates a binary signal at its output 220, 222 that follows a binary signal at its respective signal input 203, 205, and which, when disabled, by bringing its enable input near ground, puts its respective output into an essentially open-circuit condition. The output voltage of each driver 202, 204 transitions between ground (when its respective input is logic low) and the voltage of its respective voltage source V1, V2 (when its respective input is logic high). A controller (e.g., controller 112, FIG. 2) delivers three logical binary inputs to the driver circuit 200: a mode input 230; a switch control input 226 and an enable/disable input 228.

The circuit of FIG. 7 may be operated in either of two modes: in a first mode, the circuit 200 generates a three-state channel signal at its sender output 234 of the kind shown in FIGS. 5 and 6; in a second mode, the circuit generates a three-state channel signal at its sender output 234 of the kind shown in FIG. 3. Thus, use of the circuit of FIG. 7 may enable a single controller 112 to be used in both prior art three-state systems and systems using the three-state scheme according to embodiments herein. The circuit may be incorporated into a controller 12, 112 (e.g., as drivers 50a, 50b, 50n; as drivers 150a, 150b . . . 150n) or may be provided external to the controller.

The first mode of operation is asserted by holding the mode input 230 high. With the mode input high and the phase enable input 228 low ("disabled"), the output of exclusive-or logic gate (with one inverting input) 214 is low, the output of exclusive-or gate 212 is forced high and the output of OR gate 210 is also forced high. Driver 204 is therefore disabled (and its output 222 is open circuit) and driver 202 is enabled. The logic high level at the input of driver 202 causes its output to be high (e.g., at voltage V1): the sender output 234 of the circuit 200 will be in the second region of FIGS. 4 and 5, corresponding to the "disabled" state. Alternatively, with the mode input 230 high and the phase enable signal 228 high ("enabled"), the output of exclusive-or logic gate (with one inverting input) 214 will be high and the output of exclusive-or gate 212 is low. Driver 202 is therefore disabled (and its output 220 open circuit) and driver 204 is enabled. The switch control signal will be delivered to the input of driver 204 via the output of OR logic gate (with one inverting input) 216. The sender output 234 will therefore follow the logical state of the binary switch control signal input 226, transitioning between a ground (logic low) and V2 (logic high). Since V2 is less than V1, the sender output 234 is in the first region of FIGS. 5 and 6, with the logic low level of the sender output 234 corresponding to the third region (enabled-OFF) and the logic high level of the sender output 234 corresponding to the fourth region (enabled-ON).

The second mode of operation is asserted by holding the mode input 230 low. With the mode input 230 low: (1) driver 202 is enabled (via the output of exclusive-or gate 212) whenever the phase enable input 228 is high; (2) driver 204 is enabled (via the output of exclusive-or logic gate (with one inverting input) 214) whenever the phase enable input 228 is low; (3) the switch control signal is delivered to the input 203 of driver 202 by the output of OR gate 210; and (4) the input 205 of driver 204 (delivered from the output of OR logic gate (with one inverting input) 216) will be forced high when the phase enable input 228 is low ("disabled") and will follow the binary switch control signal input 226 when the phase enable input is high ("enabled"). Thus, when the phase enable input 228 is high the sender output 234 will be driven by the output of driver 202 and will follow the logical state of the binary switch control signal input 226, transitioning between a ground (logic low) and V2 (logic high). When the phase enable input is low, however, sender output 234 will be driven by the output of driver 204 and will be at a high level (i.e., at a voltage V2). Because V2 is less than V1, the signal so generated will correspond to the prior art three-state signal shown in FIG. 3.

Figure 8:
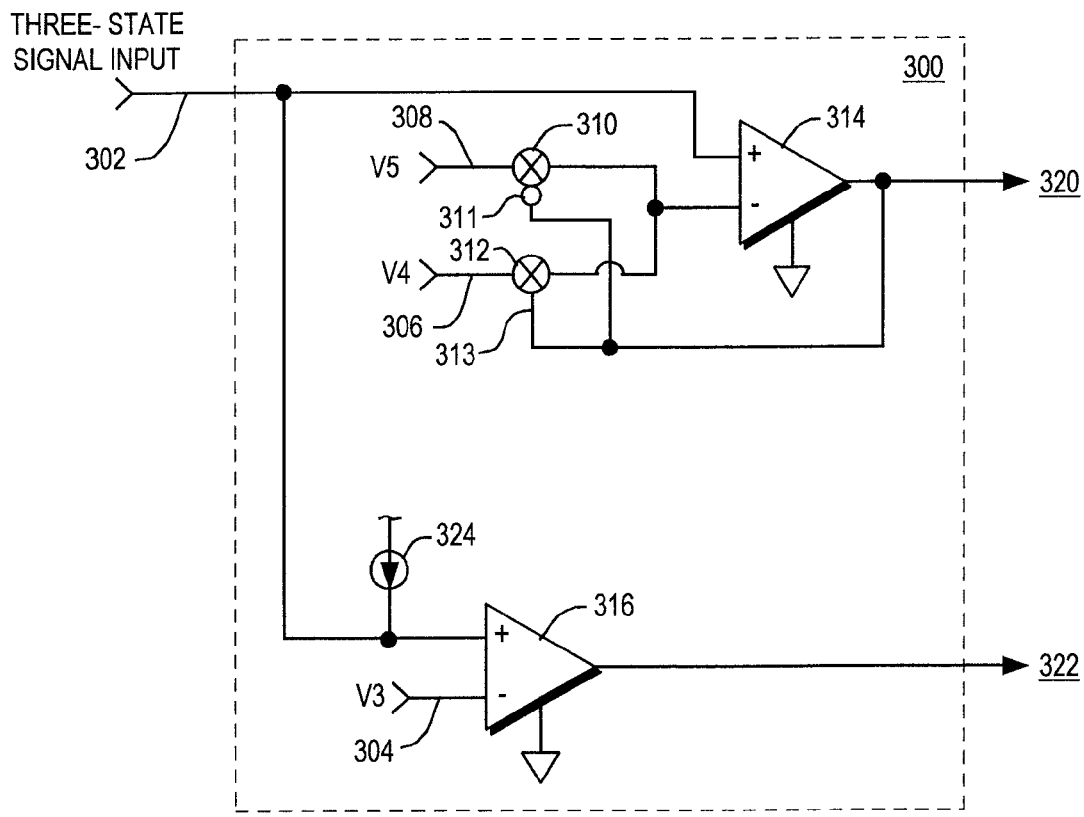
FIG. 8 is a diagram illustrating an example receiver circuit according to embodiments herein.

A receiver circuit 300 for decoding the signals of FIGS. 4 and 5 is shown in FIG. 8. The circuit comprises a first comparator 314; a second comparator 316; a controlled switch 312 with a control input 311; a controlled switch 312 with inverting control input 313; and three reference voltage sources, V3, V4 and V5, where V5>V4>V3. A three-state signal is delivered to the receiver circuit 300 at three-state signal input 302. The receiver circuit 300 may be incorporated into a phase switch controller 118a (e.g., as receivers 160a, 160b . . . 160n) or may be embodied for use external to a phase switch controller.

First comparator 314 and controlled switches 310, 312 operate together to provide level detection with hysteresis. When the output of comparator 314 is high, controlled switch 312 is enabled (via its control input 313), delivering reference voltage V5 to the inverting input of comparator 314, and controlled switch 310 is disabled (via its inverting control input 311); when the output of comparator 314 is low, controlled switch 312 is disabled (via its control input 313) and controlled switch 310 is enabled (via its inverting control input 311), delivering reference voltage V4 to the inverting input of comparator 314. Thus, if the output 320 of the first comparator 314 is low and the three-state signal input, delivered to the non-inverting input of first comparator 314, is increasing, the output 320 of first comparator 314 will go high when the three-state signal input 302 voltage increases above a value of V5. Thereafter, the first comparator output 320 will remain high until the three-state signal input 302 voltage decreases below V4. Hysteresis of this kind may provide for clean transitions at the comparator output 320 even when the rise and fall times of the three-state signal input 302 voltage may be relatively slow. Comparator 316 is a simple level detector: the output 322 of second comparator 316 is high whenever the three-state signal input 302 voltage is above V3 and the output 322 is low whenever the three-state signal input 302 voltage is below V3. The second comparator may, however, also be configured with hysteresis, as described above with respect to the first comparator 314.

An example of waveforms in a system comprising a driver circuit 200 of FIG. 7 and a receiver circuit 300 of FIG. 8 and operating with a three-state waveform of the kind shown in FIGS. 4 and 5, is shown in FIGS. 9A-9F.

With reference to FIGS. 2, 5, 7, 8 and 9, the system is characterized as follows: each three-state driver 150a, 150b . . . 150n in controller 112 (FIG. 2) comprises a driver circuit 200 of the kind shown in FIG. 7; each three state receiver 160a, 160b . . . 160n (FIG. 2) in phase switch controllers 118a, 118b . . . 118n comprises a receiver circuit 300 of the kind shown in FIG. 8; the second region (FIG. 5) occupies voltages above TH1=2.2 volts; the first region occupies a voltage range between TH0=0 volts and TH1=2.2 volts; voltage V3 (FIG. 8) is set to 0.9 volts, thereby setting threshold TH2=TH3=0.9V, the range of the third state to be between TH0=0 V and TH2=TH3=0.9V, and the range of the fourth state to be between TH2=TH3=0.9V and TH1=2.2 V; in FIG. 8, V4 is set to 2.5 V and V5 is set to 2.6 V; in FIG. 7, V1 is set to 3.3 V and V2 is set to 1.8 V; the mode input 230 (FIG. 7) is set high, enabling the driver circuit 200 to deliver the three-state waveform of the invention.

FIG. 9A shows the mode input to the driver circuit 200 (FIG. 7) set high; FIG. 9B shows an exemplary switch control input 226 (FIG. 7) to the driver circuit 200; FIG. 9C shows an exemplary phase enable input 228 (FIG. 7) to the driver circuit 200. With the inputs to the driver circuit 200 as shown in FIGS. 9A-9C, the three-state signal at the sender output 234 (FIG. 7) will appear as shown in FIG. 9D: when the phase enable signal 228 is low, the sender output voltage 234 (FIG. 9D) is forced to 3.3V (in the second region, FIG. 5); when the phase enable signal 228 is high, the sender output voltage 234 (FIG. 9D) follows the logical state of the switch control signal 226 (FIG. 9B), but is level-shifted to transition between 0 and 1.8 V in the first region. The output 320 of the hysteretic first comparator circuit in the receiver circuit 300 (FIG. 7), shown in FIG. 9E, is high when the three-state signal voltage (FIG. 9D) is above V5=2.6 V and low whenever the three-state signal voltage is below V4=2.5 V; the output 322 of the second comparator in the receiver circuit 300, shown in FIG. 9F, is high whenever the three-state signal voltage (FIG. 9D) is above V3=0.9 V and is low whenever three-state signal voltage is below V3=0.9 V.

With reference to FIGS. 2, 8 and 9, the first and second comparator outputs are delivered to phase control circuitry in a phase switch controller (e.g., phase switch controller 118a); the phase control circuitry controls the sequencing and the states of the phase switches, SP2a, SS2a (e.g., the sequencing and states shown in FIG. 6 and discussed above). For example, when the output 320 of the first comparator is high, the phase control circuitry in the phase controller 118a will sequence both switches, SP2a and SS2a, to their off states, using, if necessary, the "break before make" sequencing described above. When, however, the output of the first comparator is low, the phase control circuitry in the phase controller will sequence both switches, SP2a and SS2a, between the enabled-ON and enabled-off states (as described above) based upon the logical level at the second comparator output 322 (FIG. 8), again using, if necessary, the "break before make" sequencing described above.

In some embodiments, the receiver 300 of FIG. 8 may also comprise a "pullup" device (e.g., current source 324) to force the outputs of first and second comparators 314,326 to their high states, thereby indicating the phase-disabled state and forcing phase switches SP2a, SS2a to their OFF states. This may be useful to force phases into their OFF states in the event, e.g., that communication between the driver and receiver are lost, or that the power supply to the driver becomes defective.

In the three-state channel signal examples of FIGS. 5 and 6, both the first and second regions comprise positive values; the second region comprises values that are greater than the values included within the first region; the first and second regions are contiguous (i.e., TH1 is the upper limit of the first region and the lower limit of the second region); the fourth region comprises values that are greater than the values included within the third region; the second region indicates the disabled state; the first region indicates the enabled state; the third region represents the enabled-OFF state and the fourth region represents the enabled-ON state. This is one of many possible channel signal configurations, some examples of which are shown in FIGS. 10A, 10B and 10C.

Figure 10A:
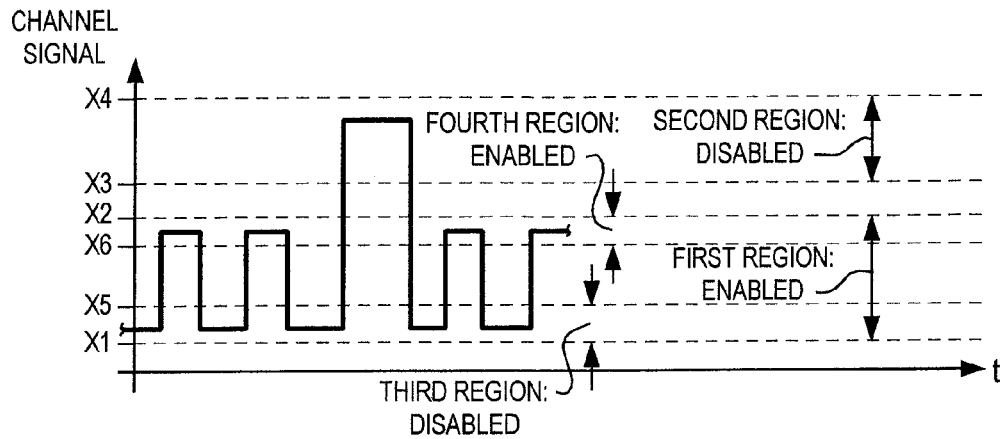
FIGS. 10A, 10B, and 10C are example timing diagrams according to embodiments herein.

In FIG. 10A, the first region spans a positive range of values between X1 and X2 which indicates the enabled state; the second region spans a positive range of values, between X3 and X4, that are greater than the values in the first region, and which indicate the disabled state; the third region spans a positive range of values between X1 and X5 and indicates the enabled-OFF state; the fourth region spans a positive range of values, between X6 and X2, that are greater than the values in the third region, and indicates the enabled-ON state.

The example of FIG. 10A is similar to the examples of FIGS. 5 and 6, except that the channel signal of FIG. 10A comprises a gap between the first and second regions (i.e., between X2 and X3). As noted earlier, this gap may be zero; the gap between the third and fourth regions (i.e., between X5 and X6) may also be reduced to zero in some applications. Therefore, in general, in the example of FIG. 10A: X1<X5<=X6<X2<=X3<X4.

Figure 10B:
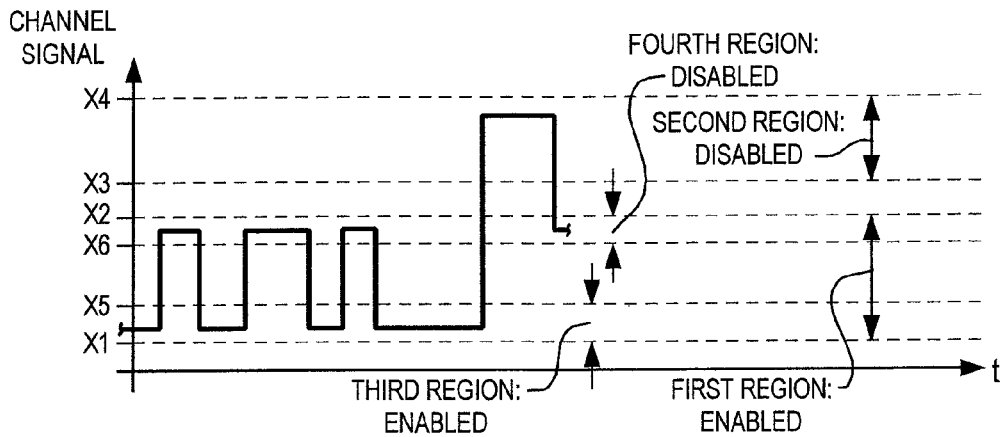
Figure 10C:
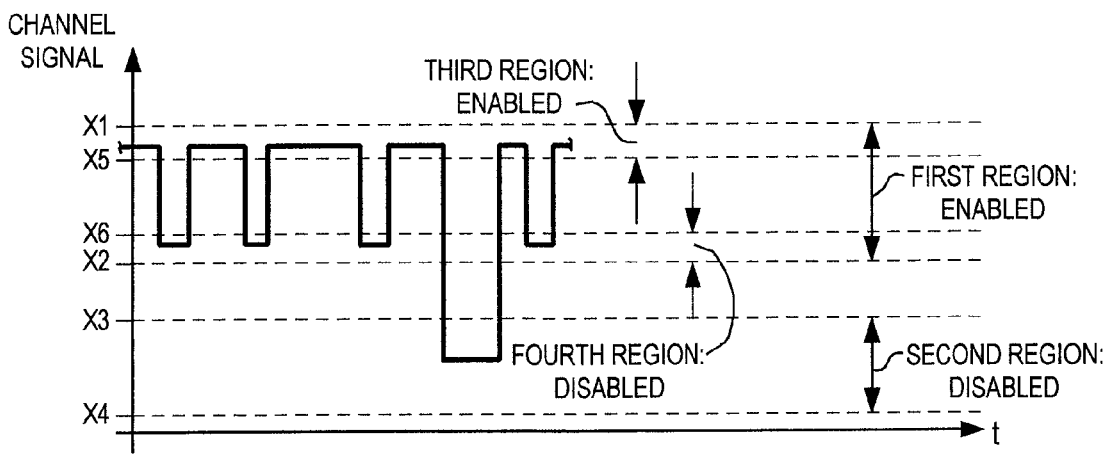

In FIG. 10B, the thresholds are the same as those in FIG. 10A but the states indicated by the third and fourth regions are reversed: in FIG. 10B the third region represents the enabled-ON state and the fourth region represents the enabled-OFF state. Therefore, in general, the relationships between the thresholds are the same in both FIGS. 10A and 10B: X1<X5<=X6<X2<=X3<X4.

In FIG. 10C, the first region spans a positive range of values between X1 and X2 indicates the enabled state; the second region spans a positive range of values, between X3 and X4, that are less than the values in the first region, and indicates the disabled state; the third region spans a positive range of values between X1 and X5 and indicates the enabled-ON state; the fourth region spans a positive range of values, between X6 and X2, that are less than the values in the third region, and indicates the enabled-OFF state. As for the examples of FIGS. 10A and 10B, one or the other of the gap between the first and second region and the gap between the third and fourth regions may be reduced to zero. Therefore, in general, in the example of FIG. 10C: X1>X5>=X6>X2>=X3>X4.

Figure 11:
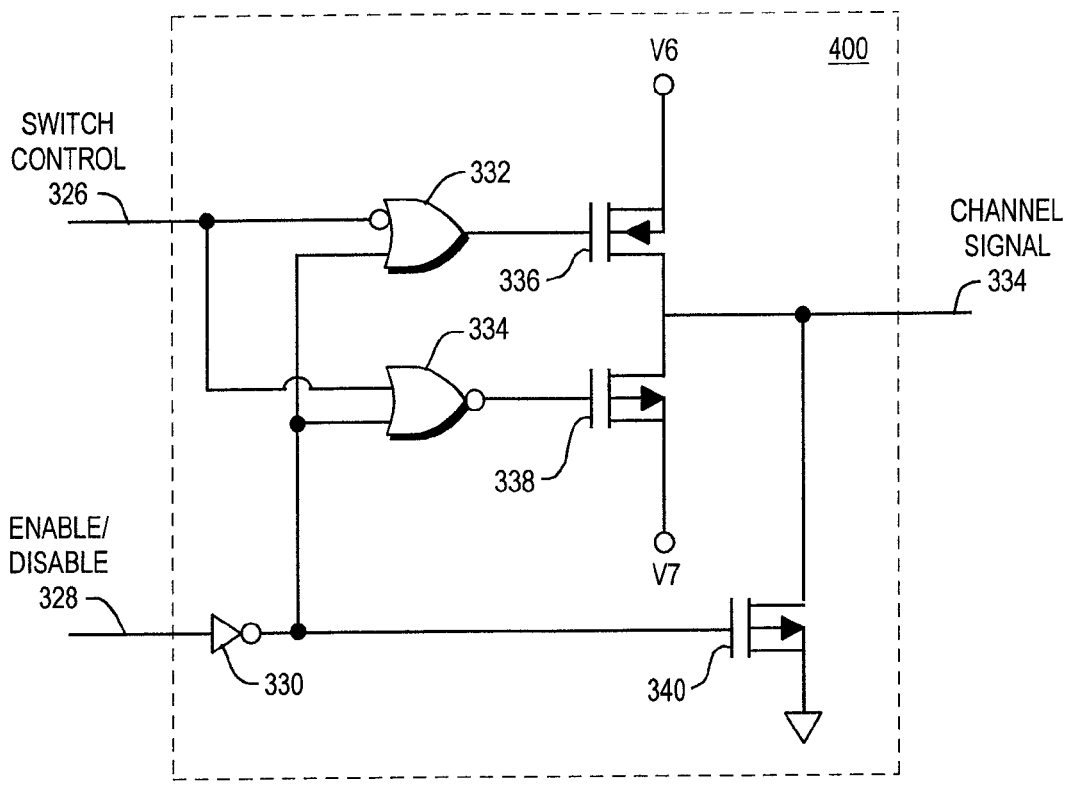
FIG. 11 is a diagram illustrating an example driver circuit according to embodiments herein.
Figure 12:
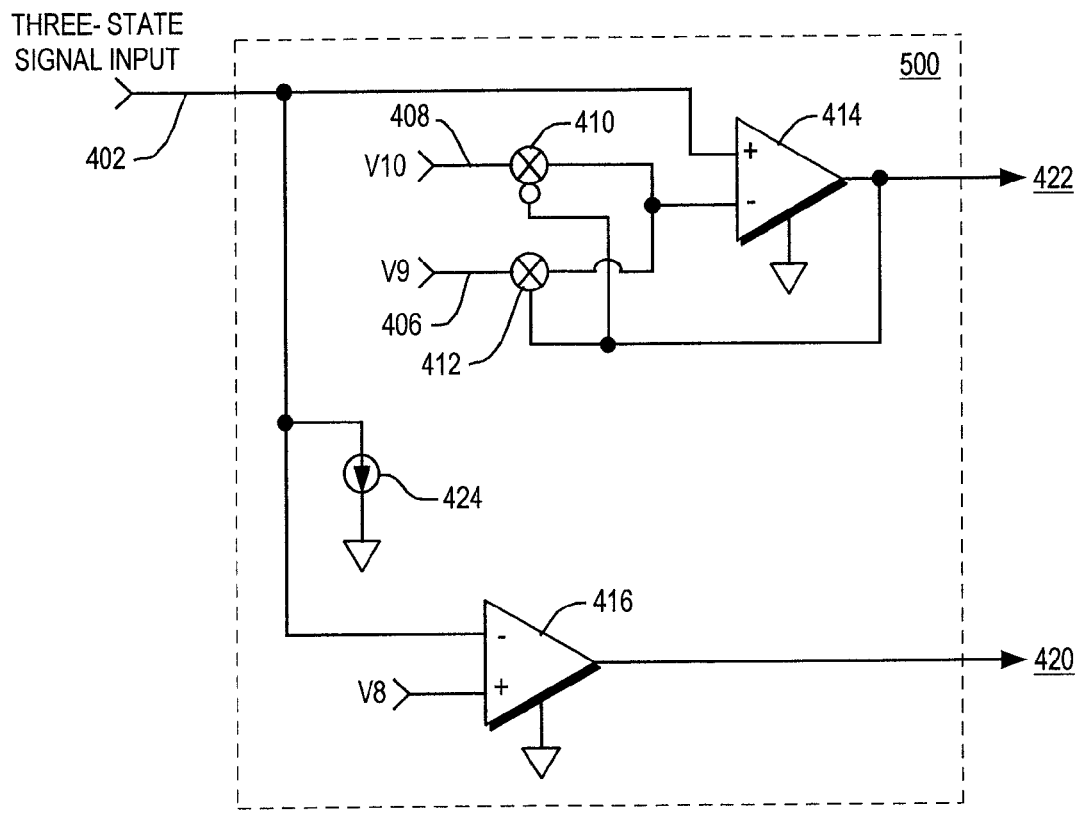
FIG. 12 is a diagram illustrating an example receiver circuit according to embodiments herein.

FIGS. 11 and 12 show, respectively, one example of a driver circuit 400 and one example of a receiver circuit 500 for use with a channel signal of the kind shown in FIG. 10C. In the Figures Waveforms in a system comprising driver circuit 400 and receiver circuit 500 are shown in FIGS. 13A-13E for the case where voltages V6=3.3V, V7=1.8V, V1=3.0V, V9=3.1V and V8=1.0V.

With reference to FIGS. 11, 12 and 13, when the enable/disable signal 328 input to receiver circuit 400 is low (indicating the phase-disabled state), the output of inverter 330 is high, the output of gate 332 is high and the output of gate 334 is low, turning n-channel FET 3400N and turning p-channel FET 336 and n-channel FET 338 OFF. With FET 3040N, the channel signal is brought to essentially zero volts, as shown in FIGS. 13B and 13C. When the enable/disable signal 328 is high (indicating that the phase is enabled), the output of inverter 330 is low, turning n-channel FET 340 OFF. When the enable/disable signal 328 is high and the switch control input signal 326 is high, the p-channel FET 336 is ON and the n-channel FET 338 is OFF, forcing the channel signal output to be essentially equal to voltage V6=3.3V; when the enable/disable signal 328 is high and the switch control input signal 326 is low, the p-channel FET 336 is OFF and the n-channel FET 338 is ON, forcing the channel signal output to be essentially equal to voltage V7=1.8V.

Figure 13A:
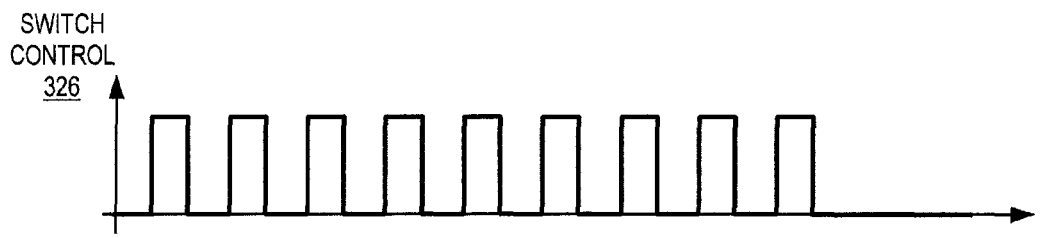
FIGS. 13A, 13B, 13C, 13D, and 13E are example timing diagrams according to embodiments herein.
Figure 13B:
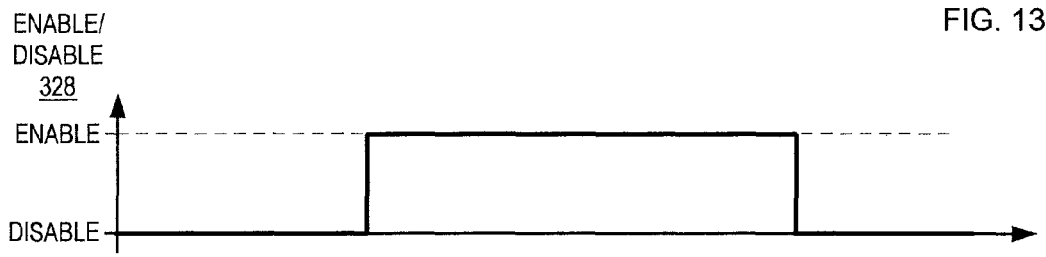
Figure 13C:
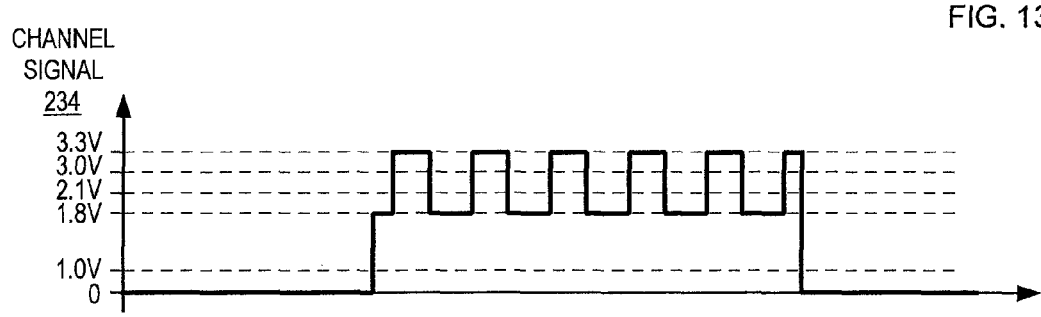
Figure 13D:
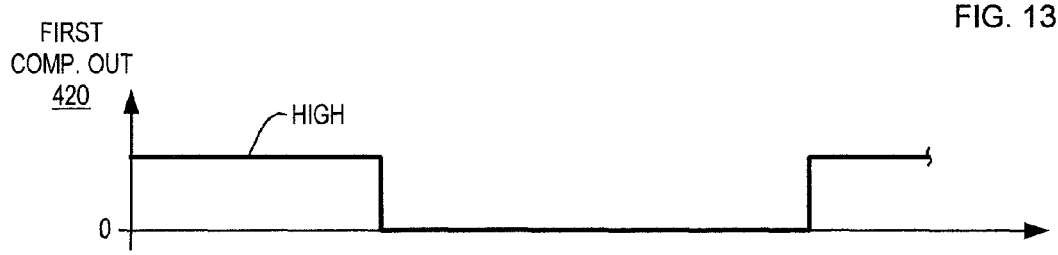
Figure 13E:
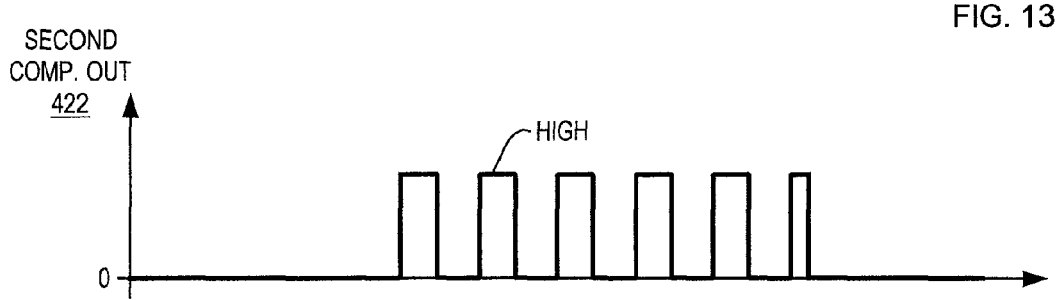

With the channel signal output 400 of driver 400 connected to the three-state signal input 402 of receiver 500, a channel signal value of essentially zero volts will cause the output 420 of first comparator 416 to be high (indicating the phase-disabled state) and a channel signal value above V8=1.0V will cause the outputs 420, 422 of, respectively, first comparator 416 and second comparator 414 to be low (indicating the phase-enabled state (FIGS. 13D and 13E). When the channel signal rises above 3.0 V, the output 422 of second comparator 414 goes high; when the channel signal drops below 2.1 V, the output 422 of second comparator 414 goes low. Thus, as shown in FIGS. 13C and 13E, as the channel signal transitions between 1.8V and 3.3V, the output 422 of second comparator 414 transitions between its low and high states.

In accordance with the above discussion, embodiments herein include a receiver circuit configured to generate the signal 320 to activate a high side switch or power switch of a power converter phase in response to detecting that the received multi-state signal 302 is in a middle state (such as between threshold value TH3 and TH1 as in FIG. 4) between a hi and low state.

Further embodiments herein include a receiver circuit 300 configured to initiate deactivation of the high side switch or power switch and activation of a synchronous switch (i.e., low side switch) in the power converter phase in response to detecting a transition of the multi-state signal 302 from the middle state to a value below a first threshold value. Further embodiments herein include a receiver circuit 300 configured to initiate deactivation of the high side switch (i.e., power switch) and low side switch (i.e., synchronous switch) in the power converter phase in response to detecting a transition of the multi-state signal 302 from the middle state above a second first threshold value.

The multi-state signal transitions from a high state to a middle state when the respective phase is activated again. As mentioned above, the middle can correspond to a time when the high side switch of a respective phase is activated (i.e., turned ON). Designating the middle state of the multi-state signal to be corresponding to activation of the high side switch circuitry enables quicker "ON" response time for a power converter phase when the power converter phase is activated to supply power to the load.

In some embodiments, the receiver 500 of FIG. 12 may also comprise a "pulldown" device (e.g., current source 424) to force the outputs of first and second comparators 314,326 to their low states, thereby indicating the phase-disabled state and forcing phase switches SP2a, SS2a to their OFF states. This may be useful to force phases into their OFF states in the event, e.g., that communication between the driver and receiver are lost, or that the power supply to the driver becomes defective.

The channel signal may be a voltage a current or any other physical quantity (e.g., light). The channel signal may span positive values only, negative values only or both positive and negative values. Note again that embodiments herein are not limited to use in switching power converters but is broadly applicable to other applications in which, e.g., a binary serial data stream is passed between a pair of units along with a control signal for enabling/disabling one or the other of the units.

Functionality supported by controller, driver, and related circuits of a respective power supply will now be discussed via flowcharts in respective FIGS. 14 through 19. Note that there will be some overlap with respect to concepts discussed above. Also, note that the steps in the below flowcharts need not always be executed in the order shown.

Figure 14:
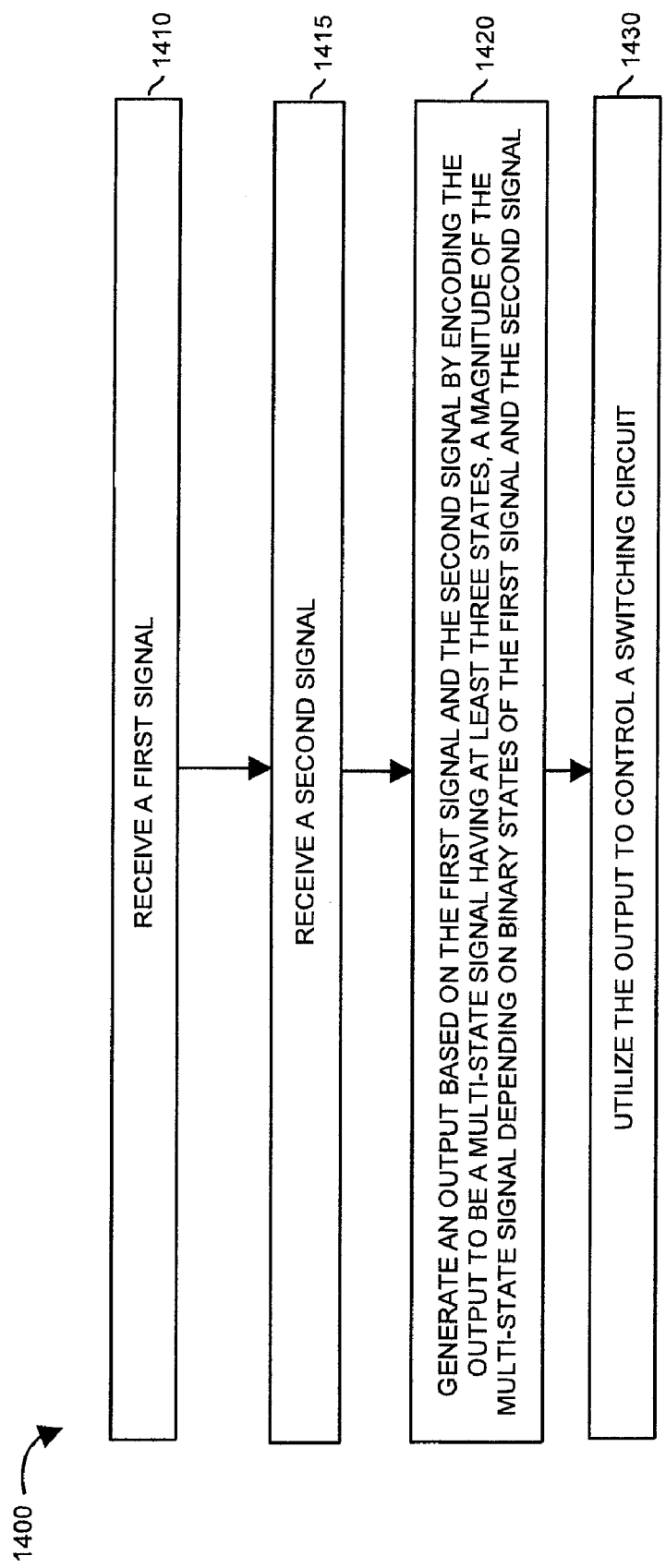
FIGS. 14-19 are example flowcharts illustrating generation and use of a multi-state signal according to embodiments herein.

More specifically, FIG. 14 is an example flowchart 1400 illustrating a technique of generating a multi-state signal according to embodiments herein.

In step 1410, the multi-state signal generator 200 receives a first signal such as a pulse width modulation signal to control switch circuitry in one or more power converter phases.

In step 1415, the multi-state signal generator 200 receives a second signal such as an enable/disable signal.

In step 1420, the multi-state signal generator 200 generates an output (e.g., channel signal 234) based on the first signal and the second signal by encoding the output to be a multi-state signal having at least three states, a magnitude of the multi-state signal depending on binary states of the first signal and the second signal.

In step 1425, the multi-state signal generator 200 utilizes the output to control a corresponding switching circuit such as a power converter phase.

Figure 15:
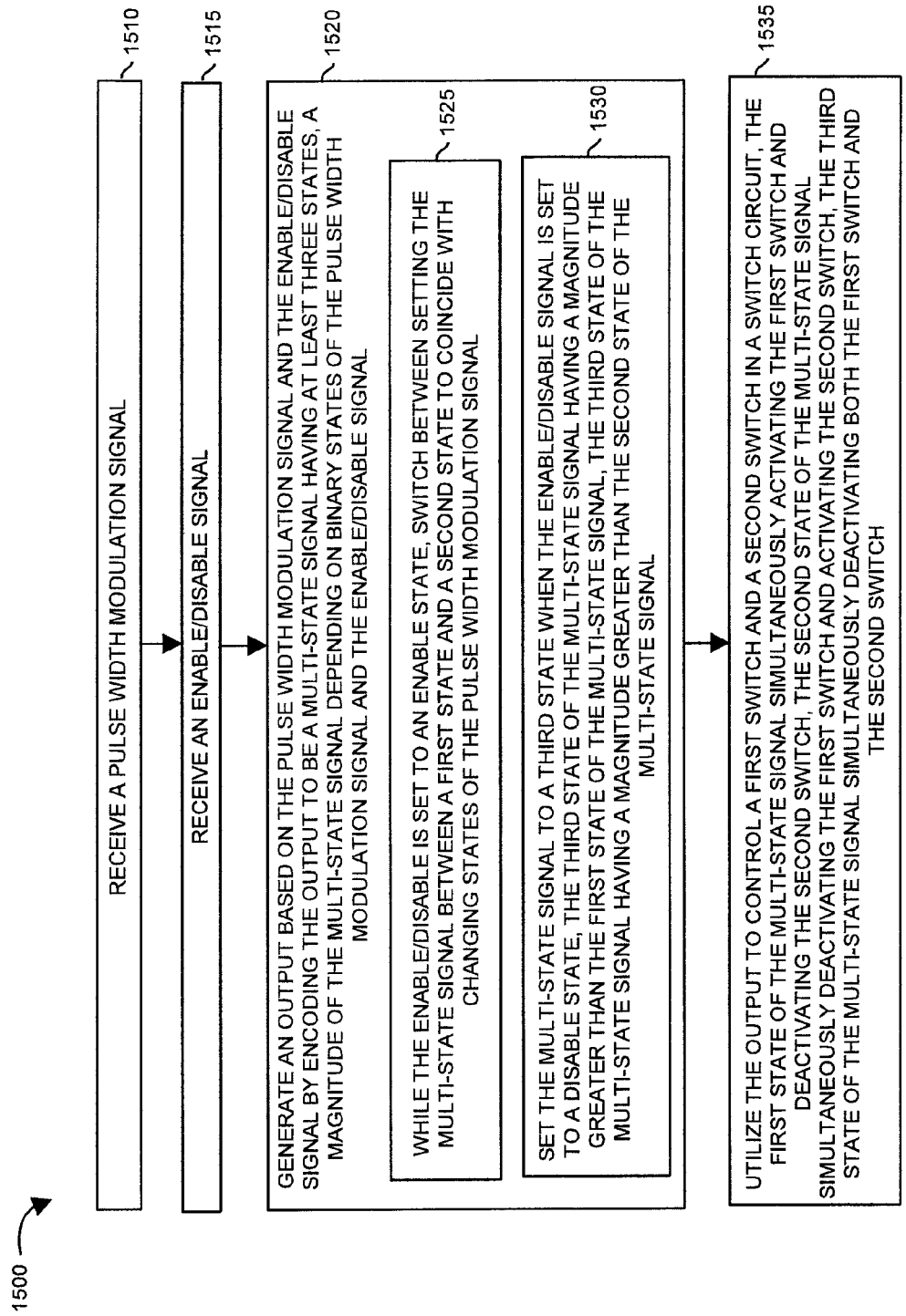

FIG. 15 is an example flowchart 1500 illustrating a technique of generating a multi-state signal according to embodiments herein.

In step 1510, the multi-state signal generator circuit 200 receives a pulse width modulation signal such as switch control signal 226.

In step 1515, the multi-state signal generator circuit 200 receives an enable/disable signal such as signal 228.

In step 1520, the multi-state signal generator circuit 200 generates an output (e.g., channel signal 234) based on the pulse width modulation signal and the enable/disable signal by encoding the output to be a multi-state signal having at least three states, a magnitude of the multi-state signal depending on binary states of the pulse width modulation signal and the enable/disable signal.

In sub-step 1525, while the enable/disable is set to an enable state, the multi-state signal generator circuit 200 switches between setting the multi-state signal (e.g., channel signal 234) between a first state and a second state to coincide with changing states of the pulse width modulation signal.

In sub-step 1530, the multi-state signal generator circuit 200 sets the multi-state signal to a third state when the enable/disable signal is set to a disable state. In one embodiment, the third state of the multi-state signal can be configured to have a magnitude greater than the first state of the multi-state signal; the third state of the multi-state signal has a magnitude greater than the second state of the multi-state signal.

In step 1535, the multi-state signal generator circuit 200 utilizes the output to control a first switch (or switch circuitry including multiple switches) and a second switch (or switch circuitry including multiple switches) in a switch circuit, the first state of the multi-state signal simultaneously activating the first switch and deactivating the second switch, the second state of the multi-state signal simultaneously deactivating the first switch and activating the second switch, the third state of the multi-state signal simultaneously deactivating both the first switch and the second switch.

Figure 16:
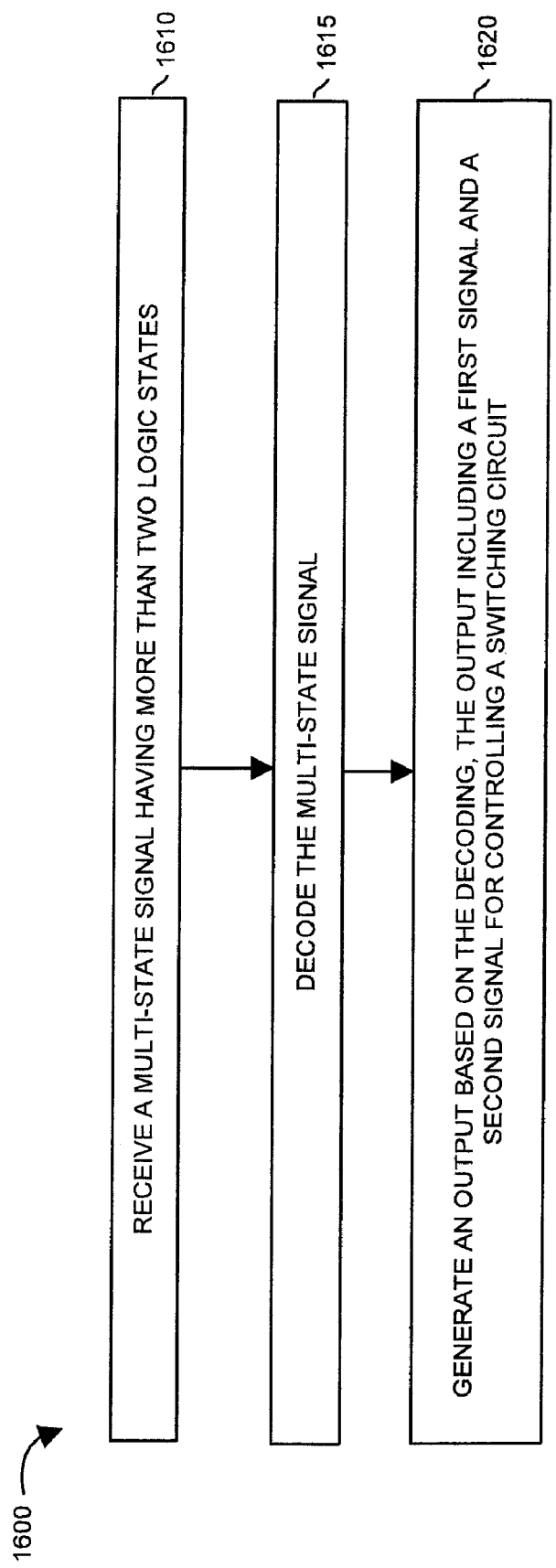

FIG. 16 is an example flowchart 1600 illustrating a technique of receiving and processing a multi-state signal according to embodiments herein.

In step 1610, the receiver circuit 300 receives a multi-state signal having more than two logic states.

In step 1615, the receiver circuit 300 decodes the multi-state signal.

In step 1620, the receiver circuit 300 generates an output based on the decoding. In one embodiment, the output includes a first signal and a second signal for controlling a switching circuit such as switches in a respective power converter phase of a power supply.

Figure 17:
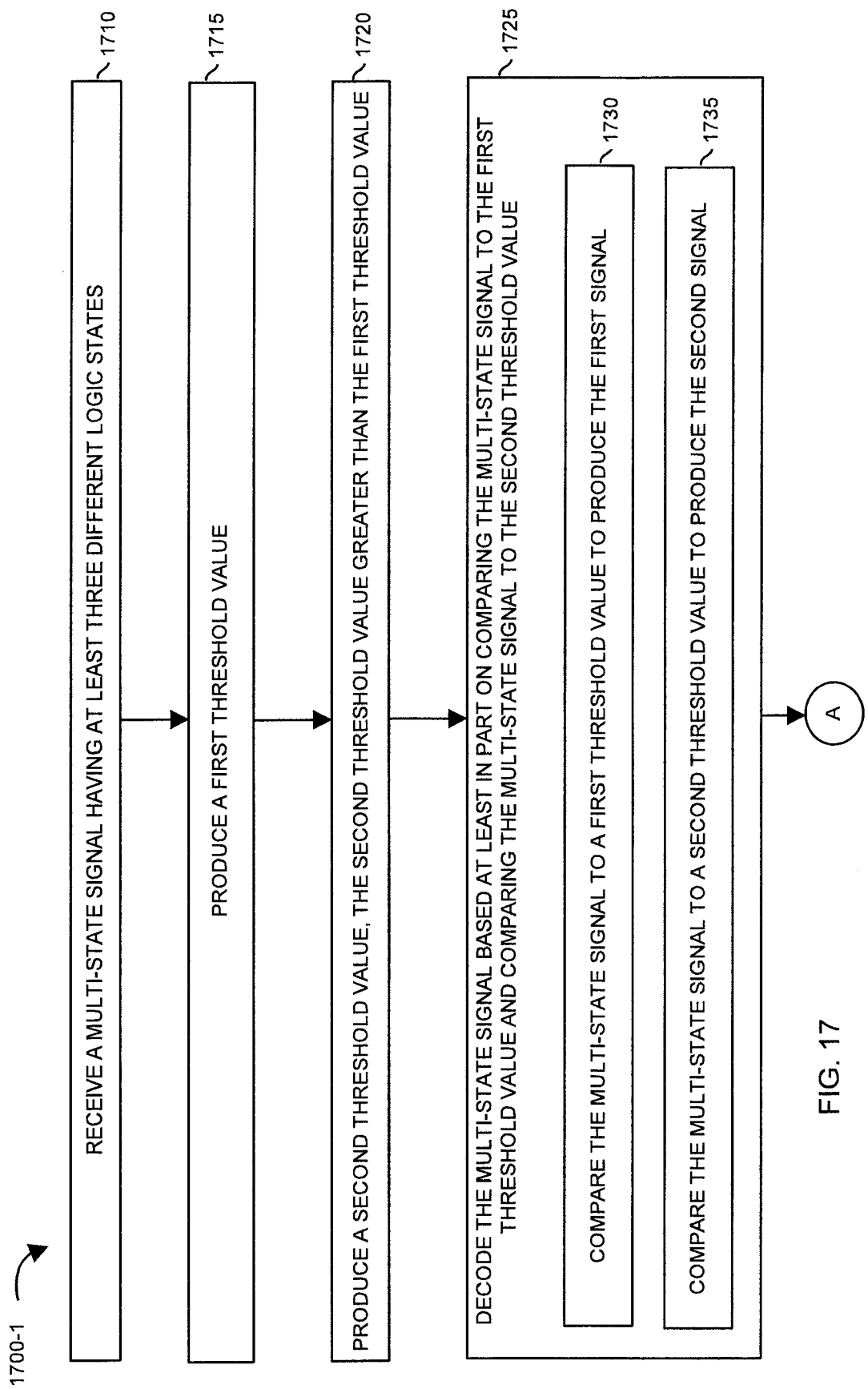
Figure 18:
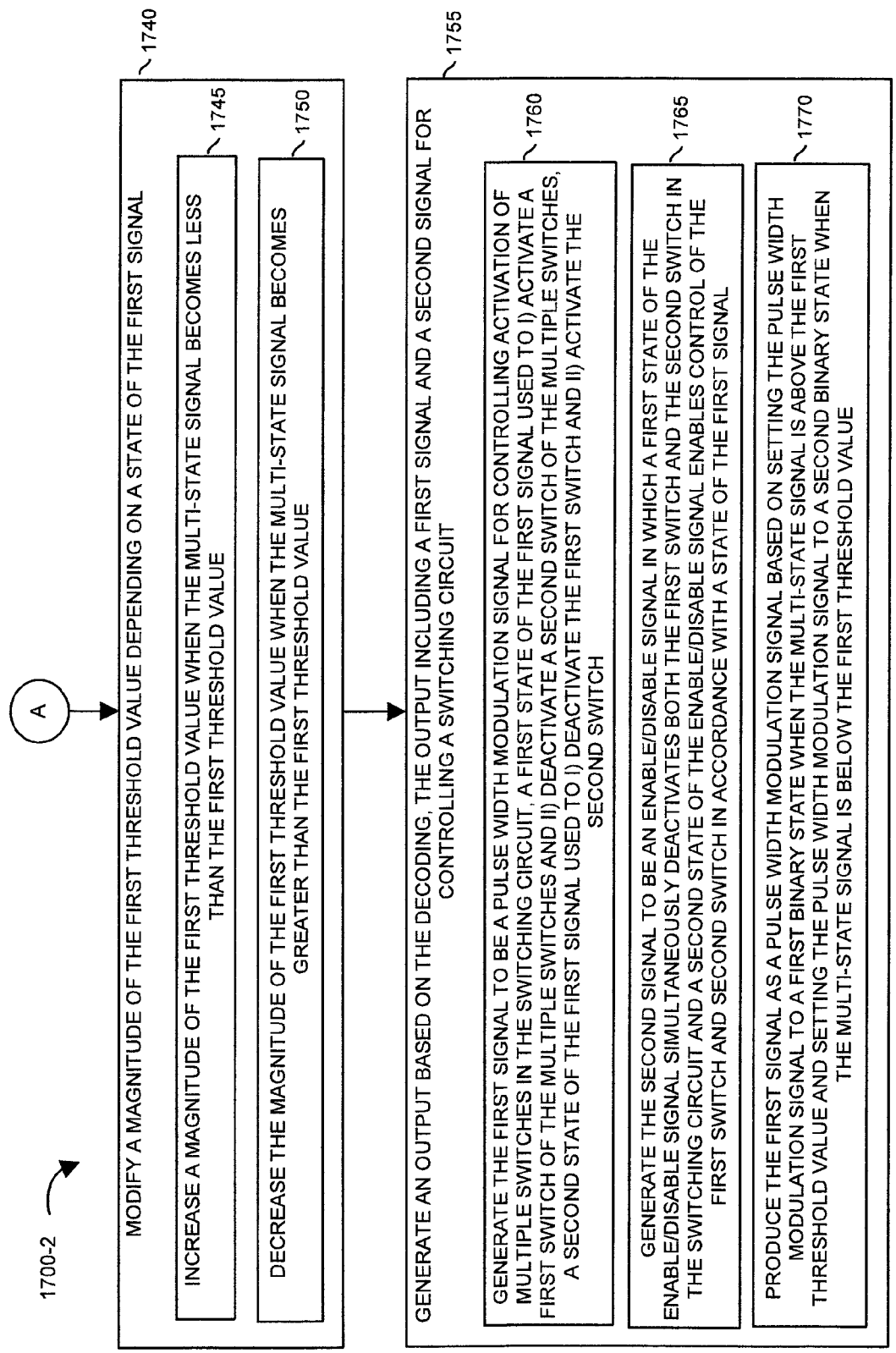

FIGS. 17 and 18 combine to form an example flowchart 1700 (e.g., 1700-1 and 1700-2) illustrating a technique of receiving and processing a multi-state signal according to embodiments herein.

In step 1710, the receiver circuit 300 receives a multi-state signal having at least three different logic states.

In step 1715, the receiver circuit 300 produces a first threshold value.

In step 1720, the receiver circuit 300 produces a second threshold value, the second threshold value can be a value greater than the first threshold value.

In step 1725, the receiver circuit 300 decodes the multi-state signal based at least in part on comparing the multi-state signal to the first threshold value and comparing the multi-state signal to the second threshold value.

In sub-step 1730, the receiver circuit 300 compares the multi-state signal to a first threshold value (e.g., voltage supplied to negative input of comparator 314 of FIG. 8) to produce a first signal (e.g., signal 320 in FIG. 8).

In sub-step 1735, the receiver circuit 300 compares the multi-state signal to a second threshold value (e.g., voltage supplied to negative input of comparator 316 of FIG. 8) to produce the second signal (e.g., signal 322 in FIG. 8).

In step 1740, the receiver circuit 300 modifies a magnitude of the first threshold value (e.g., voltage supplied to negative input of comparator 314 of FIG. 8) depending on a state of the first signal.

In sub-step 1745, the receiver circuit 300 increases a magnitude of the first threshold value when the multi-state signal becomes less than the first threshold value.

In sub-step 1750, the receiver circuit 300 decreases the magnitude of the first threshold value when the multi-state signal becomes greater than the first threshold value.

In step 1755, the receiver circuit 300 generates an output based on the decoding, the output including the first signal and the second signal for controlling a switching circuit.

In step 1760, the receiver circuit 300 generates the first signal to be a pulse width modulation signal for controlling activation of multiple switches in the switching circuit, a first state of the first signal used to i) activate a first switch of the multiple switches and ii) deactivate a second switch of the multiple switches, a second state of the first signal used to i) deactivate the first switch and ii) activate the second switch.

In step 1765, the receiver circuit 300 generates the second signal to be an enable/disable signal in which a first state of the enable/disable signal simultaneously deactivates both the first switch and the second switch in the switching circuit and a second state of the enable/disable signal enables control of the first switch and second switch in accordance with a state of the first signal.

In step 1770, the receiver circuit 300 produces the first signal as a pulse width modulation signal based on setting the pulse width modulation signal to a first binary state (when the multi-state signal is above the first threshold value) and setting the pulse width modulation signal to a second binary state (when the multi-state signal is below the first threshold value).

Figure 19:
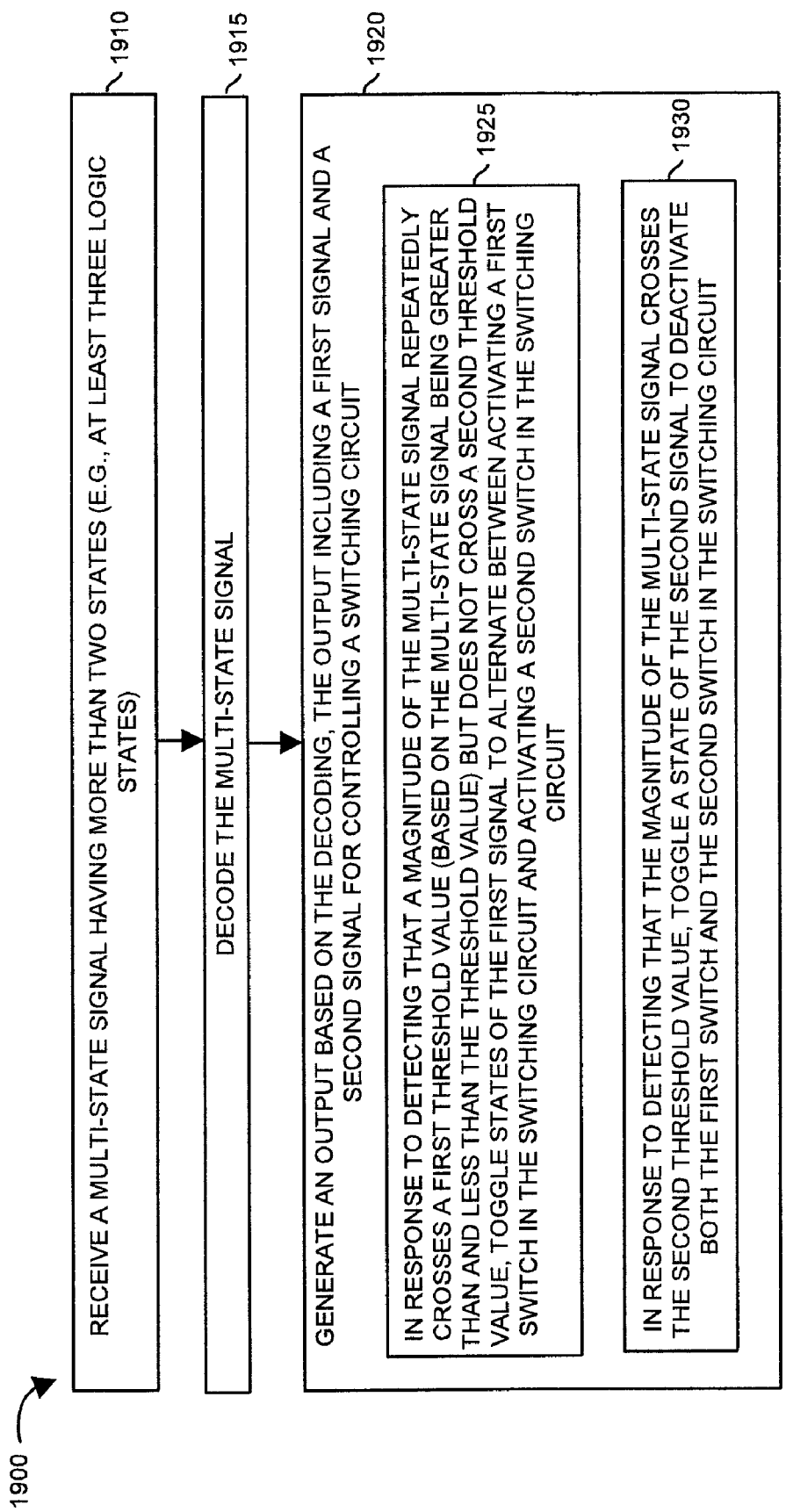

FIG. 19 is an example flowchart 1900 illustrating a technique of receiving and processing a multi-state signal according to embodiments herein.

In step 1910, the receiver circuit 300 receives a multi-state signal having more than two states (e.g., at least three logic states).

In step 1915, the receiver circuit 300 decodes the multi-state signal.

In step 1920, the receiver circuit 300 generates an output based on the decoding, the output including a first signal and a second signal for controlling a switching circuit.

In step 1925, in response to detecting that a magnitude of the multi-state signal repeatedly crosses a first threshold value (based on the multi-state signal being greater than and less than the first threshold value) but does not cross a second threshold value, the receiver circuit 300 toggles states of the first signal to alternate between activating a first switch in the switching circuit and activating a second switch in the switching circuit.

In step 1930, in response to detecting that the magnitude of the multi-state signal crosses the second threshold value, the receiver circuit 300 toggles a state of the second signal to deactivate both the first switch and the second switch in the switching circuit.

Note again that techniques herein are well suited for use in power supply applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. Power conversion apparatus comprising:
a controller comprising at least one driver;
at least one switching power converter phase, the switching power converter phase comprising a receiver;
a channel for carrying a channel signal between the driver and the receiver, a range of variation of the channel signal comprising:
a first region occupying a first continuous range of channel signal amplitudes, the first region defining an enabled state of an enable/disable signal, the first region further comprising a third region and a fourth region, the third and fourth regions being non-overlapping, and a second region, distinct from and not overlapping with the first region, that defines a disabled state of the enable/disable signal, the controller, the driver, the receiver and the channel signal configured so that:

the controller delivers an enable/disable control signal to the driver, the controller delivers a switch control signal to the driver, whenever the enable/disable control signal indicates that the power conversion phase is to be disabled, the driver sets the amplitude of the channel signal to be within the second region, whenever the enable/disable control signal indicates that the power conversion phase is to be enabled, the driver sets the amplitude of the channel signal to be within the first region and: (a) causes the channel signal to be in the third region whenever the switch control signal is in a pre-determined one of its two binary states, or (b) causes the channel signal to be in the fourth region whenever the switch control signal is within the other of its two binary states, whenever the channel signal is in the second region, the receiver sets a first binary output signal to a pre-determined one of its two states to indicate that the power conversion phase is to be disabled, and whenever the channel signal is in the first region, the receiver sets the first binary output signal to the other of its two states to indicate that the power conversion phase is to be enabled and: (a) sets a switch control output signal to a pre-determined one of its two binary states whenever the channel signal is in the third region, or (b) sets the switch control output signal to the other of its two binary states whenever the channel signal is in the fourth region.

2. The power conversion apparatus of claim 1 in which the switching power conversion phase comprises a phase controller, a power switch and a synchronous switch, the power conversion phase configured so that:

whenever the first binary output signal indicates that the power conversion phase is to be disabled, the phase controller turns the power and synchronous switches off, and whenever the first binary output signal indicates that the power conversion phase is to be enabled, the phase controller adjusts the states of the power and synchronous switches based upon the state of the switch control output signal.

3. The power conversion apparatus of claim 2 in which;

the first region comprises a range of values that are between X1 and X2, the second region comprises a range of values that are between X3 and x4, the third region comprises a range of values that are between X1 and X5, the fourth region comprises a range of values that are between X6 and X2, where X1<X5<=X6<X2<=X3<X4, and the pre-determined one of the states of the switch control signal causes the power switch to be off and the synchronous switch to be on and the other state of the switch control signal causes the power switch to be on and the synchronous switch to be off.

4. The power conversion apparatus of claim 2 in which;

the first region comprises a range of values that are between X1 and X2, the second region comprises a range of values that are between X3 and X4, the third region comprises a range of values that are between X1 and X5, the fourth region comprises a range of values that are between X6 and X2, where X1<X5<=X6<X2<=X3<X4, and the pre-determined one of the states of the switch control signal causes the power switch to be on and the synchronous switch to be off and the other state of the switch control signal causes the power switch to be off and the synchronous switch to be on.

5. The power conversion apparatus of claim 2 in which;

the first region comprises a range of values that are between X1 and X2, the second region comprises a range of values that are between X3 and X4, the third region comprises a range of values that are between X1 and X5, the fourth region comprises a range of values that are between X6 and X2, where X1>X5>=X6>X2>=X3>X4, and the pre-determined one of the states of the switch control signal causes the power switch to be on and the synchronous switch to be off and the other state of the switch control signal causes that the power switch to be off and the synchronous switch to be on.

6. The power conversion apparatus of claim 3 in which X1 is zero volts, the fourth region comprises a value of 1.8 volts and the second region comprises a value of 3.3 volts.

7. The power conversion apparatus of claim 4 in which X1 is zero volts, the fourth region comprises a value of 1.8 volts and the second region comprises a value of 3.3 volts.

8. The power conversion apparatus of claim 5 in which X4 is zero volts, the fourth region comprises a value of 1.8 volts and the second region comprises a value of 3.3 volts.

9. The power conversion apparatus of claim 1 in which the channel signal is a voltage.

10. The power conversion apparatus of claim 1 in which the channel signal is a current.

11. Three-state communication apparatus comprising:

at least one driver, the driver comprising a first binary signal input and a second binary signal input;

at least one receiver;

a channel for carrying a channel signal between the driver and the receiver, a range of variation of the channel signal comprising:

a first region occupying a first continuous range of channel signal amplitudes, the first region defining a first state of a first binary logic signal, the first region further comprising a third region and a fourth region, the third and fourth regions being non-overlapping, and a second region, distinct from and not overlapping with the first region, that defines the other state of the first binary logic signal, the driver, the receiver and the channel signal configured so that: the controller delivers an enable/disable control signal to the driver, whenever the first binary signal input is in a first one of its binary states, the driver sets the amplitude of the channel signal to be within the second region, whenever the first binary signal input is in the other of its binary states, the driver sets the amplitude of the channel signal to be within the first region and: (a) causes the channel signal to be in the third region whenever the second binary input signal is in a pre-determined one of its two binary states, or (b) causes the channel signal to be in the fourth region whenever the second binary input signal is within the other of its two binary states, whenever the channel signal is in the second region, the receiver sets a first binary output signal to a pre-determined one of its two states, and whenever the channel signal is in the first region, the receiver sets the first binary output signal to the other of its two states and: (a) sets a second binary output signal to a pre-determined one of its two binary states whenever the channel signal is in the third region, or (b) sets the second binary output signal to the other of its two binary states whenever the channel signal is in the fourth region.

12. The apparatus of claim 11 in which;
the first region comprises a range of values that are between X1 and X2,
the second region comprises a range of values that are between X3 and x4,
the third region comprises a range of values that are between X1 and X5,
the fourth region comprises a range of values that are between X6 and X2,
where X1<X5<=X6<X2<=X3<X4.

13. The apparatus of claim 11 in which;
the first region comprises a range of values that are between X1 and X2,
the second region comprises a range of values that are between X3 and X4,
the third region comprises a range of values that are between X1 and X5,
the fourth region comprises a range of values that are between X6 and X2,
where X1<X5<=X6<X2<=X3<X4.

14. The power conversion apparatus of claim 11 in which;
the first region comprises a range of values that are between X1 and X2,
the second region comprises a range of values that are between X3 and X4,
the third region comprises a range of values that are between X1 and X5,
the fourth region comprises a range of values that are between X6 and X2,
where X1>X5>=X6>X2>=X3>X4.

15. The apparatus of claim 12 in which X1 is zero volts, the fourth region comprises a value of 1.8 volts and the second region comprises a value of 3.3 volts.

16. The apparatus of claim 13 in which X1 is zero volts, the fourth region comprises a value of 1.8 volts and the second region comprises a value of 3.3 volts.

17. The apparatus of claim 14 in which X4 is zero volts, the fourth region comprises a value of 1.8 volts and the second region comprises a value of 3.3 volts.

18. The apparatus of claim 11 in which the channel signal is a voltage.

19. The apparatus of claim 11 in which the channel signal is a current.

20. A method comprising:
receiving a first signal;
receiving a second signal;
generating an output based on the first signal and the second signal by encoding the output to be a multi-state signal having at least three states, a magnitude of the multi-state signal depending on binary states of the first signal and the second signal; and
utilizing the output to control a switching circuit;
wherein the first signal is a pulse width modulation signal and the second signal is an enable/disable signal; and
wherein generating the output includes:
switching the multi-state signal between a first state and a second state to coincide with changing states of the pulse width modulation signal when the enable/disable is set to an enable state; and
setting the multi-state signal to a third state when the enable/disable signal is set to a disable state.

21. The method as in claim 20, wherein the third state of the multi-state signal has a magnitude greater than the first state of the multi-state signal; and
wherein the third state of the multi-state signal has a magnitude greater than the second state of the multi-state signal.

22. The method as in claim 20, wherein utilizing the output to control the switching circuit includes controlling a first switch and second switch in the switching circuit; and
wherein the first state of the multi-state signal simultaneously deactivates the first switch and activates the second switch;
wherein the second state of the multi-state signal simultaneously activates the first switch and deactivates the second switch; and
wherein the third state of the multi-state signal simultaneously deactivates both the first switch and the second switch.

23. A method comprising:
receiving a multi-state signal having more than two states;
decoding the multi-state signal; and
generating an output based on the decoding, the output including a first signal and a second signal for controlling a switching circuit;
wherein generating the output includes:
generating the first signal to be a pulse width modulation signal for controlling activation of multiple switches in the switching circuit, a first state of the first signal used to i) activate a first switch of the multiple switches and ii) deactivate a second switch of the multiple switches, a second state of the first signal used to i) deactivate the first switch and ii) activate the second switch.

24. The method as in claim 23 further comprising:
generating the second signal to be an enable/disable signal in which a first state of the enable/disable signal simultaneously deactivates both the first switch and the second switch in the switching circuit and a second state of the enable/disable signal enables control of the first switch and second switch in accordance with a state of the first signal.

25. A method comprising:
receiving a multi-state signal having more than two states;
decoding the multi-state signal; and
generating an output based on the decoding, the output including a first signal and a second signal for controlling a switching circuit;
producing a first threshold value;
producing a second threshold value, the second threshold value greater than the first threshold value;
wherein decoding the multi-state signal includes comparing the multi-state signal to the first threshold value and comparing the multi-state signal to the second threshold value; and
wherein generating the output includes producing the first signal as a pulse width modulation signal based on setting the pulse width modulation signal to a first binary state when the multi-state signal is above the first threshold value and setting the pulse width modulation signal to a second binary state when the multi-state signal is below the first threshold value.

26. The method as in claim 23 further comprising:
comparing the multi-state signal to a first threshold value to produce the first signal;
comparing the multi-state signal to a second threshold value to produce the second signal; and
modifying a magnitude of the first threshold value depending on a state of the first signal.

27. The method as in claim 26, wherein modifying the first threshold value includes:
increasing a magnitude of the first threshold value when the multi-state signal becomes less than the first threshold value; and
decreasing the magnitude of the first threshold value when the multi-state signal becomes greater than the first threshold value.

28. A method comprising:
receiving a multi-state signal having more than two states;
decoding the multi-state signal; and
generating an output based on the decoding, the output including a first signal and a second signal for controlling a switching circuit;
wherein generating the output includes:
in response to detecting that a magnitude of the multi-state signal repeatedly crosses a first threshold value but does not cross a second threshold value, toggling states of the first signal to alternate between activating a first switch in the switching circuit and activating a second switch in the switching circuit.

29. The method as in claim 28 further comprising:
in response to detecting that the magnitude of the multi-state signal crosses the second threshold value, toggling a state of the second signal to deactivate both the first switch and the second switch in the switching circuit.

30. A method comprising:
receiving a multi-state signal having more than two states;
decoding the multi-state signal; and
generating an output based on the decoding, the output including a first signal and a second signal for controlling a switching circuit
in response to detecting that multi-state signal is in a middle state between a hi and low state of the multi-state signal, generating the first signal to activate a first switch in the switching circuit;
in response to detecting a transition of the multi-state signal from the middle state by crossing a first threshold value, initiating deactivation of the first switch and activation of a second switch in the switching circuit; and
in response to detecting a transition of the multi-state signal from the middle state by crossing a second first threshold value, initiating deactivation of the first switch and deactivation of the second switch in the switching circuit.

* * * * *